United States Patent
Van Den Brink et al.

(10) Patent No.: US 9,743,565 B2
(45) Date of Patent: Aug. 22, 2017

(54) WIRELESS POWER TRANSFER THROUGH CONDUCTIVE MATERIALS

(71) Applicant: Access Business Group International LLC, Ada, MI (US)

(72) Inventors: Joseph C. Van Den Brink, Coopersville, MI (US); Hai D. Nguyen, Grand Rapids, MI (US); Benjamin C. Moes, Wyoming, MI (US); Neil W. Kuyvenhoven, Ada, MI (US)

(73) Assignee: Access Business Group International LLC, Ada, MI (US)

( * ) Notice: Subject to any disclaimer, the term of this patent is extended or adjusted under 35 U.S.C. 154(b) by 587 days.

(21) Appl. No.: 14/370,794

(22) PCT Filed: Jan. 7, 2013

(86) PCT No.: PCT/US2013/020493
§ 371 (c)(1),
(2) Date: Jul. 7, 2014

(87) PCT Pub. No.: WO2013/103948
PCT Pub. Date: Jul. 11, 2013

(65) Prior Publication Data
US 2015/0048752 A1 Feb. 19, 2015

Related U.S. Application Data

(60) Provisional application No. 61/584,266, filed on Jan. 8, 2012.

(51) Int. Cl.
*H05K 9/00* (2006.01)
*H02J 5/00* (2016.01)
(Continued)

(52) U.S. Cl.
CPC .......... *H05K 9/0049* (2013.01); *H01F 38/14* (2013.01); *H02J 5/005* (2013.01); *H02J 7/025* (2013.01);
(Continued)

(58) Field of Classification Search
CPC ......... H01F 38/14; H02J 5/005; H02J 7/0044; H02J 7/025; H02J 7/027; H05B 37/0227; H05K 9/0049
See application file for complete search history.

(56) References Cited

U.S. PATENT DOCUMENTS

2010/0188041 A1  7/2010  Mizuo
2011/0057891 A1  3/2011  Ham et al.
(Continued)

FOREIGN PATENT DOCUMENTS

EP   1 793 307    6/2007
GB   2470577      12/2010

OTHER PUBLICATIONS

International Search Report and Written Opinion of the International Searching Authority for International Application No. PCT/US2013/020493 mailed May 9, 2014.
(Continued)

*Primary Examiner* — Latanya Bibbins
(74) *Attorney, Agent, or Firm* — Warner Norcross and Judd LLP

(57) ABSTRACT

An electrical component with conductive material(s) that is suitable for use within the electromagnetic field path of a wireless power transfer system. The electronic component includes conductive materials that are sufficiently thin to absorb no more than an acceptable amount of the electromagnetic field, yet thick enough to remain sufficiently conductive to perform the desired electrical function. In embodiments in which the wireless power supply delivers
(Continued)

up to 20 watts of power, the conductive materials are not substantially thicker than about $\frac{1}{10}$ the skin depth of the material at the anticipated wireless power frequency. The electrical component may be disposed at any location between the wireless power supply transmitter and the remote device receiver. The present invention permits the use of a wide rang of electrical components in the field path, such as a display, a sensor or a component capable of selectively operating as both.

31 Claims, 22 Drawing Sheets

(51) Int. Cl.
    *H02J 7/02*        (2016.01)
    *H01F 38/14*     (2006.01)
    *H05B 37/02*     (2006.01)
    *H02J 7/00*        (2006.01)

(52) U.S. Cl.
CPC ........ *H05B 37/0227* (2013.01); *H02J 7/0044* (2013.01); *H02J 7/027* (2013.01)

(56) References Cited

U.S. PATENT DOCUMENTS

2012/0068551 A1* 3/2012 Pooley .................. H01M 2/021
                                                                         307/104
2012/0119703 A1* 5/2012 Bersenev .............. H02J 7/0044
                                                                         320/112

OTHER PUBLICATIONS

Weston, D.A., et al., "Comparative magnetic field Shielding Effectiveness of thin conductive coatings", published May 31, 2005, and downloaded at http://www.emcconsultinginc.com/docs/thincoat.pdf, pp. 1-14.

* cited by examiner

WIRELESS POWER TRANSFER THROUGH
CONDUCTIVE MATERIALS

BACKGROUND OF THE INVENTION

The present invention relates to the field of wireless power transfer, and more particularly to systems and methods of transferring wireless power through conductive metals.

There has been a widespread increase in efforts to implement wireless power transfer systems in both commercial and residential settings. Wireless power systems offer the promise of eliminating power/charging cords for a wide range of electrically powered devices, including not only handheld electronics, such as cell phones, media players, wireless headsets and personal digital assistants, but also higher power devices, such as appliances, tools and electric vehicles. Inductive wireless power transfer systems use electromagnetic fields to transfer power from the power supply to the remote device without the need for wires or any direct electrical contact.

In many applications, the wireless power supply includes a power transfer surface on which a remote device can be placed to receive wireless power. The wireless power supply typically includes a primary coil, or other electromagnetic field transmitter, positioned below the power transfer surface. In use, the primary coil produces an electromagnetic field that is present over the power transfer surface. As a result, a remote device placed on the power transfer surface will be located within and capable of receiving power through the electromagnetic field.

One of the potential challenges faced by wireless power systems arises from the fact that electromagnetic fields interact with conductive materials. More specifically, when conductive materials are placed in the presence of a varying electromagnetic field, the field generates eddy currents within conductive material, which act to dissipate the electromagnetic field and produce heat. This principle is well known and conductive materials are commonly used when it is desirable to shield electromagnetic fields. Given the inherent nature of conductive materials, the use of conductive materials in an around wireless power supplies can be problematic. Because conductive materials are an integral part of many electric and electrical components, these problems can place significant limitations on the types of electric and electrical components that can be situated in and around wireless power supplies, particularly in the electromagnetic field path between the primary coil and the remote device.

SUMMARY OF THE INVENTION

The present invention provides an electrical component with conductive material(s) that is suitable for use within the electromagnetic field of a wireless power transfer system. The electronic component includes conductive materials that are sufficiently thin to absorb no more than an acceptable amount of the electromagnetic field, yet thick enough to remain sufficiently conductive to perform the desired electrical function. In one embodiment, the conductive materials extend substantially perpendicular to the direction of the electromagnetic field and are sufficiently thin to avoid excessive power loss and excessive heat gain. Although the amount of acceptable power loss and acceptable heat gain may vary from application to application, in most practical applications, heat gain is the primary factor in determining material thickness because power loss will be relatively small in most practical applications. In typical applications in which the wireless power supply delivers up to 20 watts of power, the conductive materials are not substantially thicker than about $\frac{1}{10}$ the skin depth of the material at the anticipated operating frequency.

The present invention allows the use of a wide variety of electrical components within the electromagnetic field of a wireless power supply. Conductive materials in accordance with the present invention can be used to provide electrical components to illuminate the transmitter or receiver surface, display information about the system, be used as a proximity or pressure sensor, can be used to shield the system from radiating EMC or EMI energy on the transmitter or receiver or both, and can be used to create a more aesthetically pleasing surface by giving the appearance of a metallic finish. These thin conductive materials may also be used to provide conductive power in certain applications.

The electrical component may be disposed at essentially any location between the transmitter in the wireless power supply and the receiver in the remote device. In one embodiment, the electrical component is disposed in the wireless power transmitter between the transmitter and the receiver in the remote device. For example, the wireless power supply may include a power transfer surface on which a remote device may be placed to receive power, and the electrical component may be disposed on or adjacent to the power transfer surface. In another embodiment, the wireless power transfer system may include a resonating adaptor that is separate from the wireless power supply and the remote device. The resonating adaptor may include a coil configured to receive power from the wireless power supply via an electromagnetic field and to perpetuate the electromagnetic field to extend the range of the wireless power supply. The resonating adaptor may include a power transfer surface on which a remote device may be placed to receive power, and the electrical component may be disposed on or adjacent to the power transfer surface. In other embodiments, the electrical component may be integrated into the remote device. For example, the electrical component may be in or on the surface through which wireless power enters the remote device. This may allow the undersurface of a remote device to be illuminated even though it is within the electromagnetic field path, or allow the remote to receive conductive power from a conductive charging surface.

In one aspect, the electrical component is a display. The display may be an electroluminescent ("EL") display having an electroluminescent material sandwiched between a pair of sufficiently thin conductive layers. In this embodiment, the combined thickness of the top and bottom layers is not substantially thicker than about $\frac{1}{10}$ the skin depth of the material within the anticipated operating frequencies. In one embodiment, the bottom conductive layer is one or more opaque electrodes, and the top layer is one or more transparent electrodes. The transparent conductive layer may be Indium Tin Oxide ("ITO") and it may be applied to a transparent substrate (or support layer). For simple displays, the bottom conductive layer may include one or more generally planar electrodes and the top conductive layer may include one or more corresponding generally planar electrodes. For more complex displays, the bottom conductive layer may include a plurality of parallel strips and the top conductive layer may a plurality of parallel strips running substantially perpendicular to the strips of the bottom layer.

In some applications, the display may be configured to illuminate when a remote device is within a certain distance of the wireless power supply. For example, in some applications, the wireless power supply and the remote device may be capable of communicating through a medium range communication method, such as Bluetooth, WiFi and other short wave radio sources. When the wireless power supply recognizes that a remote device is sufficiently near, the illumination may alert the user to the presence of the wireless power supply and provide a visual indication of where to place the remote device to receive power.

In one aspect, the electrical component is a sensor or an array of sensors. In one embodiment, the sensor is a proximity sensor having one or more pads of thin conductive material. The proximity sensor may be a capacitive sensor. In this embodiment, each pad may be configured to have a capacitive response when in sufficient proximity to a conductive material. For example, the wireless power supply may include a controller than applies power to each pad and determines the response of the pad. In one embodiment, the electrical component is a plurality of sensors that may be used, for example, to determine the location of a remote device on the power transfer surface. The sensors may be arranged in a regular pattern over the power transfer surface, and each may include a separate pad that is configured to have a capacitive response when in sufficient proximity to a conductive material. The wireless power supply may apply power to and separately assess the response of each pad.

In one embodiment, the sensor or sensor array may include a common ground plane shared by each of the sensors. In this embodiment, the wireless power supply may include a controller that reads the applied voltage and/or current and the return voltage and/or current through the ground plane. The wireless power supply may be able to sense the presence of a foreign object based on the difference between the applied and return measurements. The common ground plane may be coupled to the controller through a switch so that the common ground plane can be disconnected when not desired.

In one embodiment, the electrical component is a pressure sensitive sensor or sensor array. In this embodiment, each sensor may include a layer of piezoelectric or piezoelectric material disposed between two thin conductive layers. The combined thickness of the two thin conductive layers may be no more than about 1/10 the skin depth of the material at the frequency of the wireless power supply.

In one embodiment, the electrical component is both a sensor and a display. In this embodiment, the display may be an electroluminescent display as previously described. In addition to powering the electroluminescent display, the top electrode(s) (or top and bottom electrodes) may function as a capacitive sensor(s) capable of determining when certain objects are within sufficient proximity to the sensor. For example, the top electrodes may be utilized as capacitive sensors to determine when and where a remote device has been placed on the power transfer surface. As another example, the electrodes may be utilized as a capacitive sensor to sense when a user's finger has been placed in a specific location. When operating as a capacitive sensor, the system may applying power below the level required to illuminate the electroluminescent display and may include one or more sensors to monitor the current and/or voltage applied to the sensors. A controller may be provided to determine when an object is in proximity to the sensor based on the current and/or voltage measurements.

In one aspect, the conductive material provides a selective shield that shields electromagnetic fields above a certain frequency while allowing electromagnetic fields of lower frequency to pass.

In another aspect, the conductive materials may be used to provide a surface in a wireless charging system with contacts that allow conductive charging. In one embodiment, this aspect of the present invention provides a wireless power supply with exposed conductive materials that allows a wireless power supply to supply power to remote devices that are configured to receive power wirelessly and to remote devices that are configured to receive power through exposed electrical contacts. In another embodiment, this aspect of the present invention provides a remote device with exposed conductive materials that allow the remote device to receive power from a wireless power supply or a conductive charger.

In yet another aspect, the conductive material may be used to provide a surface with a metallic appearance for aesthetic purposes. The thin conductive material will allow electromagnetic fields to pass through the surface, but will still appear metallic. A hard top-coat may be applied over the conductive material to protect it from wearing away.

These and other features of the invention will be more fully understood and appreciated by reference to the description of the embodiments and the drawings.

Figure 1:
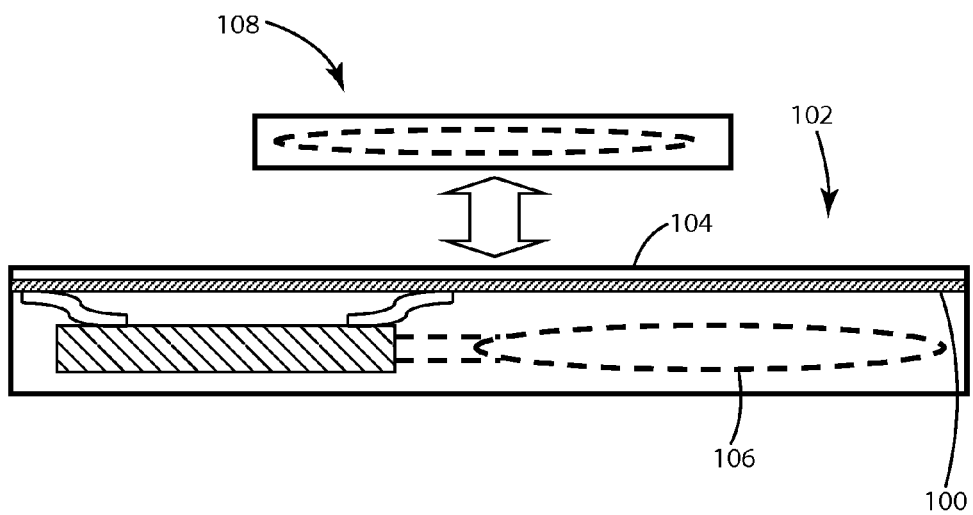
FIG. 1 is a schematic representation of a wireless power supply system with conductive materials in wireless power supply in the electromagnetic field path.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DESCRIPTION OF CURRENT EMBODIMENTS

I. Overview

Figure 2:
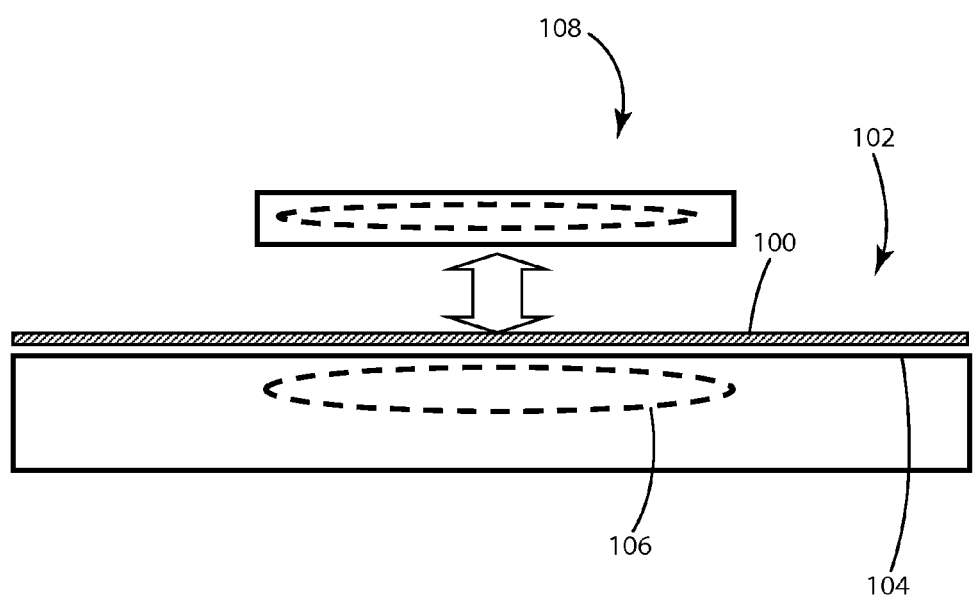
FIG. 2 is a schematic representation of a wireless power supply system with conductive materials adjacent the wireless power supply in the electromagnetic field path.
Figure 3:
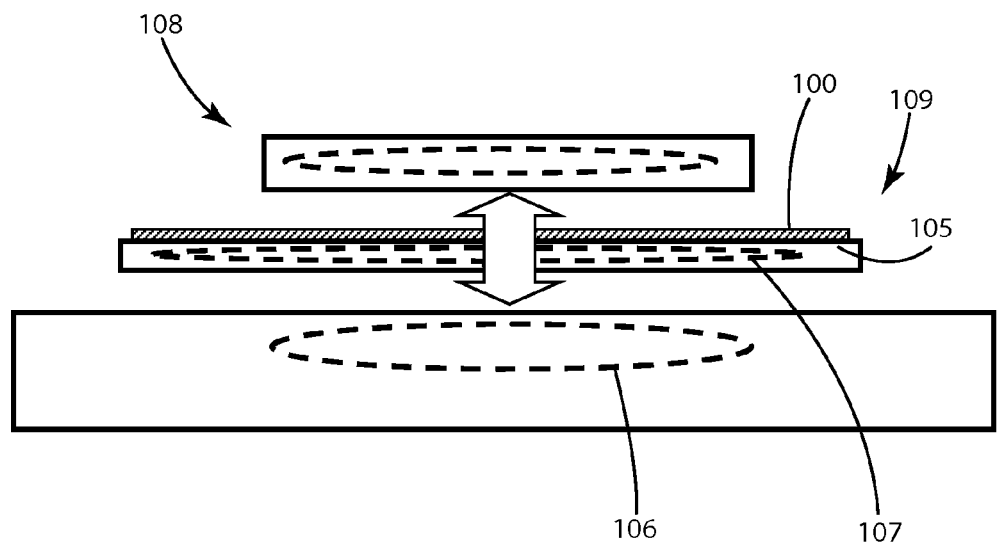
FIG. 3 is a schematic representation of a wireless power supply system with conductive materials in an intermediate component capable of being positioned in the electromagnetic field path between the wireless power supply and the remote device.

The present invention is generally directed to electrical components with conductive material incorporated into the electromagnetic field path of a wireless power system. The conductive material is configured to be sufficiently thin that it does not cause unacceptable heat gain or power loss when wireless power is being transferred. As schematically represented in FIGS. 1-3, the electrical components may be disposed in essentially any location within the flow path of the electromagnetic field from the wireless power supply to the remote device. For example, as shown in FIG. 1, the conductive material 100 may be disposed in a wireless power supply 102 below the power transfer surface 104. As another example, shown in FIG. 2, the conductive material 100 may be disposed above the power transfer surface 104 of the wireless power supply 102. In this embodiment, the conductive material 100 may be secured directly atop the power transfer surface 104 or may be separate and simply placed atop the power transfer surface 104. Another example is shown in FIG. 3. In this embodiment, the conductive material 100 is disposed in or on a resonating adaptor 106 configured to be positioned between the wireless power supply 102 and the remote device 108.

The present invention allows the use of a wide variety of electrical components in the electromagnetic field path of a wireless power environment. As described in more detail below, type of electrical component may vary from application to application. For example, the electrical component may be a display used to illuminate a component of the wireless power supply system (such as the wireless power supply, the remote device or an intermediate component) or to provide text/figures that provide information about wireless power supply system. For example, the electrical component may be a dielectric-based electroluminescent display, an OLED display or and E-ink type display. These displays can provide illuminated charging zones, directional alignment information, charging status, device information or essentially any other information concerning the wireless power supply system or the remote device. If the inductive power supply and the remote device are enabled to communicate with one another through a medium-range communication method (Bluetooth, WiFi, other short wave radio sources), the devices may communicate with one another that a remote device is within range of an inductive power supply. The inductive power supply may then light its surface with a glow, or provided information using the OLED or E-ink technology to provide graphics or text directing the user to the charging location. The wireless power supply may also illuminate or provide information periodically or in response to user input, such as a button or mechanical element for user input, or a sensor array on the surface of the transmitter and the surrounding area. With a sensor array, the wireless power supply may sense that a user has placed a remote device on the power transfer surface, and may be in need of placement guidance.

The display can be powered and controlled directly from the wireless power supply controller or analog circuitry. Alternatively, the display can be power using a wireless power receiver coil capable of obtaining power from the electromagnetic field produced by the wireless power supply. When a separate receiver coil is used to power the display, the receiver and display control circuits can be located within the wireless power supply, or they can be located in an adaptor placed within the wireless power transfer system. The display can even be made into an integrated coil and display circuit to reduce the cost and complexity. The display receiver coil has current induced when the alternating magnetic field passes through it, which can be either rectified (in the case of displays that require DC current) or used to directly power and control the display areas.

The electrical component may alternatively be a sensor or sensor array capable of sensing information useful to the system, such as the presence of a remote device on a wireless power supply power transfer surface or user interaction with the surface. In the context of sensors, the present invention involves transferring inductive power through the large areas of conductive material that are used to create the sensors, for example, the electrodes in pressure, proximity, capacitance, resistance and other types of sensors. These sensors may be used to provide device presence and size, as well as the possibility of device material, weight and possible user interaction through the addition of integrated buttons or other controls into the surface. Typically, pressure, capacitive, resistive and other types of close proximity sensors use areas of conductive material to apply voltage and/or current and measure the response of the material to determine proximity. For example, pressure-sensitive sensors often measure the voltage across a piezoelectric material, and calculate the applied pressure by comparing the measured voltage to a reference. Capacitive sensors often apply a voltage to a conductive plane and measure the resonant frequency of the circuit to determine if a capacitive material has been placed in proximity with the conductive plane. Capacitive sensors can also use a series of conductive planes and measure the interaction of the different "zones" to determine if a capacitive material has been placed in proximity to both conductive areas.

By detecting the presence of a remote device, a wireless power supply may begin interrogating the remote device to determine if it can be charged wirelessly, and if so, begin transferring power. This is advantageous because a proximity sensor typically uses much lower power than a wireless power transmitter that simply applies power to the transmitting coil intermittently. When multiple proximity sensors (e.g. a sensor array) are used, a wireless power supply may also be able to determine the location of the remote device and the alignment of that device to the transmitting coil. The wireless power supply may also use this information to provide feedback to the user about the alignment, or lack of alignment, and guide the user to properly align the remote device. This alignment feedback can be done using a display in accordance with the present invention. The sensors for the system can be printed or deposited on the surface of the wireless power supply, the surface of the transmitter coil/shielding assembly, or on any other substrate and added to the system. By layering conductive areas of material with piezoelectric, dielectric or other type of materials that respond to changes in pressure, capacitance, or magnetic or electric field intensity, these sensors can be build right into the wireless power supply. The conductive areas are then connected either to analog circuitry which passes information to the controller of the wireless power supply. Alternatively, the sensor/sensor array may be located in other components of the wireless power supply system, such as a resonating adaptor.

Figure 29:
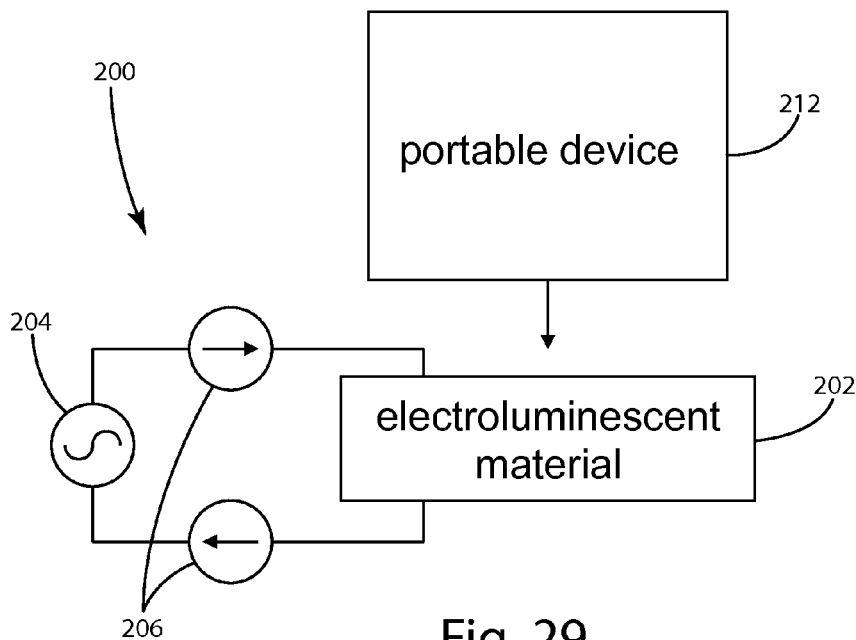
FIG. 29 is a schematic representation of a remote device positioned in proximity to an electroluminescent display.
Figure 30:
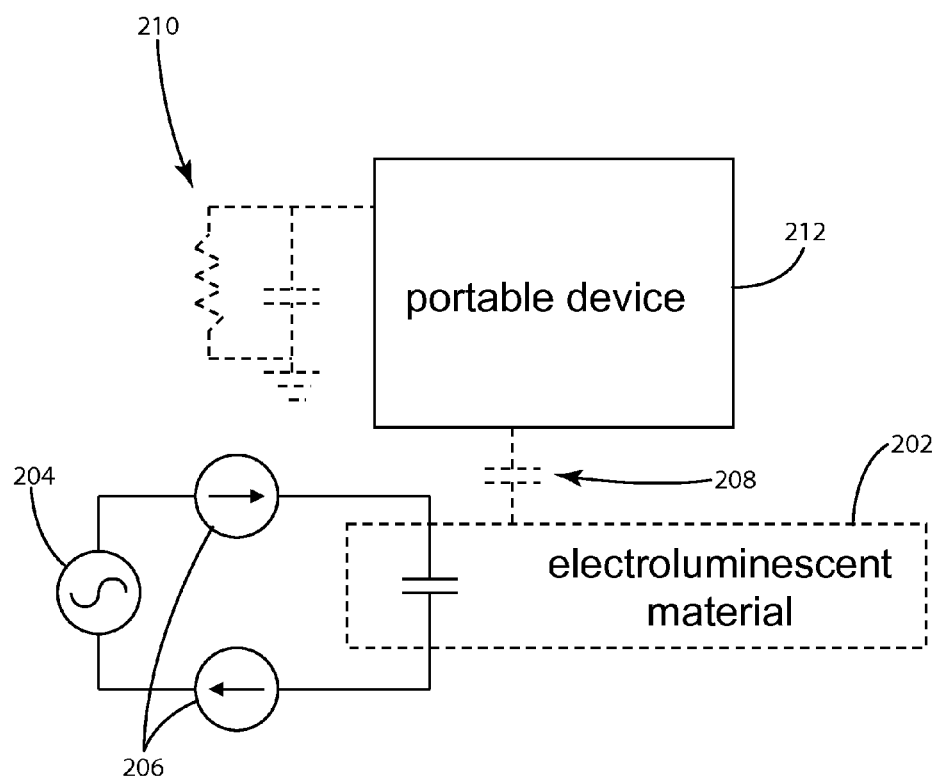
FIG. 30 is a schematic representation similar to FIG. 29 showing how the remote device creates an effective capacitance that allows capacitive sensing through the electroluminescent display.

In some embodiments, the electrical component may provide multiple functions, such as being capable of operating as a display or as a sensor. For example, FIGS. 29 and 30 illustrate a system having an electrical component that can be selectively operated to function as a display or as a proximity sensor. FIG. 29 is a schematic representation of an electrical component system 200 showing an electroluminescent material 202 connected to an AC power source 204. AC power is delivered to the electroluminescent material 202 using thin conductive materials that form electrodes on opposite sides of the electroluminescent material. The system includes sensors 206, such as voltage and/or current sensors, monitoring the characteristics of the power provided to the electroluminescent material. When sufficient power is applied to the electroluminescent material, the material 202 illuminates. FIG. 30 is a block diagram similar to that of FIG. 29, except that it shows how an object (e.g. a portable device 212) creates an effective capacitance 208 between the material and the object, and the object in turn has a resistive or capacitive coupling to ground 210. As a result, the presence of object affects the current and/or voltage applied to the electrical component, which can be detected by the sensors 206.

II. Material Thickness

Generally, the electrical components of the present invention are configured so that the conductive material incorporated into the components does not unacceptably impact wireless power transfer. More specifically, in each embodiment, the thickness of the conductive material is selected to avoid excessive power losses in the electromagnetic field and to avoid excessive heat gain in the conductive material. As a result, material thickness is based on the power loss and heat capacity characteristics of the materials being used. In some applications, heat gain may be the determinative factor and, in other applications, power loss may be the determinative factor. For example, in some applications, the power loss criteria may be more stringent and compliance with the power loss criteria will result in compliance with the heat gain criteria, while in other applications, the heat gain criteria may be more stringent and compliance with the heat gain criteria will result in compliance with the power loss criteria. In some applications, it may be desirable to consider both criteria.

The amount of acceptable power loss and the amount of acceptable heat gain may vary from application to application. However, in most typical applications, the heat gain criteria is more stringent than the power loss criteria and compliance with the heat gain criteria will automatically result in compliance with the power loss criteria. For most typical applications, the maximum temperature rise above an ambient condition (typically about 25° C.) is limited due to various concerns, such as comfort or user interaction concerns, or material stability concerns. For example, a surface having a conventional conductive coating may heat up beyond about 45° C. causing a lithium battery in a remote device to stop charging due to an over temperature condition. To prevent excessive heating, the power loss per unit volume in a conductive material will typically be limited to roughly 1 Watt/cm$^3$—it being understood that heat gain is generally directly proportional to lost power. This power per unit volume is appropriate for most conductive materials, especially when the material is limited in how much heat can be pulled away from the material through a heat sink or fan. If a transmitter uses a fan, heat sink or is otherwise provided with a mechanism to pull heat away from the conductive material, a higher value can be used (such as 1.5-2 Watt/cm$^3$) without resulting in excessive heat gain, however, a system having a higher value may have a higher power loss and therefore may reduce the overall transfer efficiency to an unacceptable level.

One method for determining power loss through a material (and consequently heat gain) is to calculate the percentage of the magnetic flux that is lost in passing through the material and multiply that against the amount of power passing through the material per unit volume. The percentage of the magnetic flux that is lost when passing through the material can be calculated using the following formula:

$$FieldLoss\% = \frac{\int_0^d e^{-l/\delta} dl}{\int_0^d e^{-l/\delta} dl + \int_d^{10*\delta} e^{-l/\delta} dl}$$

where l is the distance into the material, d is the thickness of the material, and δ is the skin depth of the material. The term "skin depth" is a reference to the power absorption of a material and is discussed in more detail below.

Figure 31:
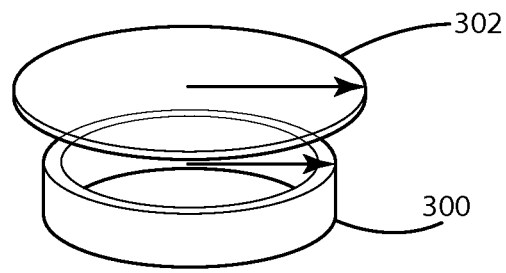
FIG. 31 is a schematic representation of a transmitter coil and a layer of conductive material.
Figure 32:
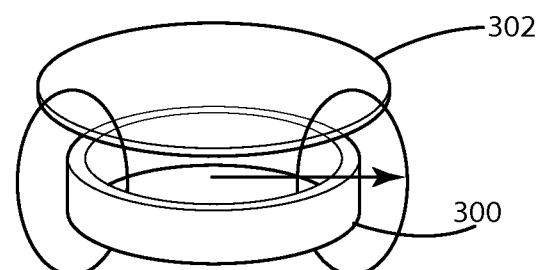
FIG. 32 is a schematic representation of a transmitter coil and a layer of conductive material.
Figure 33:
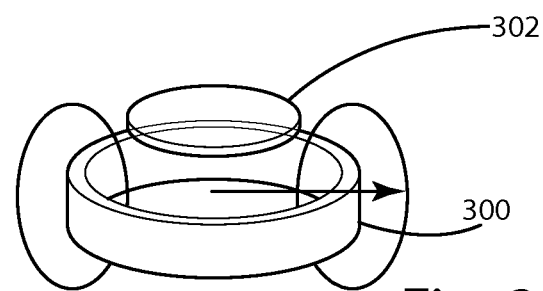
FIG. 33 is a schematic representation of a transmitter coil and an alternative layer of conductive material.

The amount of power lost in a given system will also vary depending on how much of the electromagnetic field passes through the conductive material. Because the strength of the electromagnetic field tapers off gradually at increasing distances from the transmitter, it is impractical to consider the entire electromagnetic field when assessing power lost. Accordingly, in one embodiment, the present invention analyzes power loss using the area of the "effective electromagnetic field area." For purposes of this disclosure, the term "effective electromagnetic field area" refers to the area around the transmitter in which at least ninety percent of the electromagnetic field passes. FIG. 31 is a schematic representation of a transmitter coil 300 positioned below a conductive material 302. FIG. 31 illustrates the radius of the conductive material 300 and the transmitter coil 302. FIG. 32 is similar to FIG. 31 except that it shows the exemplary field lines and an exemplary effective field radius for one possible system. In FIG. 32, the conductive material 302 is of sufficient size to cover the entire effective electromagnetic field. Accordingly, the entire effective field will pass through the conductive material. In FIG. 33, the conductive material 302 is not of sufficient size to cover the entire effective electromagnetic field. Accordingly, only a portion of the effective field will pass through the conductive material 302. If the conductive material does not cover the entire surface of the transmitter coil, then the percent loss is scaled by the percentage of effective field coverage.

In the embodiments of FIGS. 31-33, the transmitter and conductive material are circular. To calculate the power loss per unit volume of the conductive material in the context of these circular components, the following formula may be used:

$$100 \text{ mW/cm}^3 > \frac{FieldLoss\% * P}{2 * \pi * r_f^2 * \delta}$$

where P is the power being transferred and $r_f$ is the radius of the area around the coil where the effective electromagnetic field is captured. As a material becomes thicker, its power loss per unit volume does not change, however, because of the thin nature of these materials, the heat rise increases dramatically with thickness since the heat is dissipated in such a small cross sectional area. For example, a material that is 1/10 the thickness of the skin depth will heat up more than a material 1/20 the skin depth, even though their volumetric power loss may not change as much. To account for this, the power lost is normalized to the skin depth of the material δ. As noted above, it is desirable for the power loss to be less than 100 mW/cm$^3$ to avoid excessive heat gain. As a result, the formula reflects that the power loss should be less than 100 mW/cm$^3$. In applications where the acceptable amount of heat gain varies, the formula may be ready adapted to reflect the applicable acceptable heat gain. For example, in applications with an effective heat sink (or other cooling mechanism), the acceptable power loss may increase thereby potentially allowing for the use of thicker conductive materials.

If the conductive material does not cover the effective field area of the transmitter, then a percentage of the field being transferred passes around the material without causing eddy currents in the conductive material. If that is the case, then a scalar based on material radius $r_m$ and effective field radius (which is typically at least slightly larger than the coil radius) is used. In this context, the following scaled formula may be used:

$$100 \text{ mW/cm}^3 > \left(\frac{r_m}{r_f}\right) * \frac{FieldLoss\% * P}{2 * \pi * r_m^2 * \delta}$$

It should be noted that the preceding power loss formulas are intended for use in the context of circular transmitters and circular conductive materials. The formulas can be readily adapted for transmitters and conductive materials of other geometries.

The percentage power loss formula provided above incorporates the skin depth of the conductive material. The skin depth reflects a particular conductive material's ability to absorb electromagnetic fields and varies not only with material properties, but also with characteristics of the electromagnetic field, such as frequency and field strength. The following paragraphs discuss power loss in more detail with reference to skin depth and electromagnetic field frequency. As discussed in more detail below, the permissible thickness of the conductive material may vary depending on the characteristics of the electromagnetic field, such as frequency and field strength, but, in the context of a typical low-power wireless power supply (e.g. less than 20 Watts) with a standard-sized transmitter and a conductive material that covers the effective electromagnetic field, the conductive material may be not substantially thicker than about 1/10 the skin depth of the material within the anticipated operating frequencies. In this context, a conductive material that is not substantially thicker than about 1/10 the skin depth of the material within the anticipated operating frequencies will result in acceptable heat gain (generally less than 100 mW/cm$^3$) and acceptable power loss (generally 5% or less).

Figure 4:
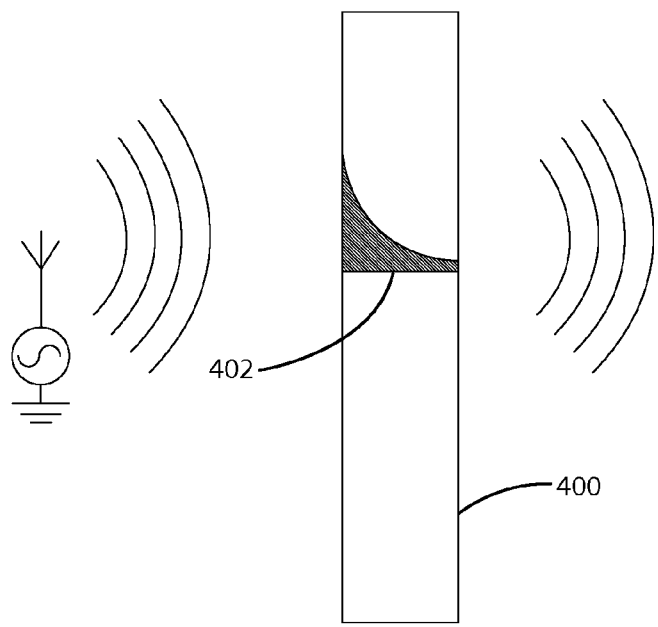
FIG. 4 is a representation of current density through a conductive material placed in proximity to a radiating antenna.
Figure 5:
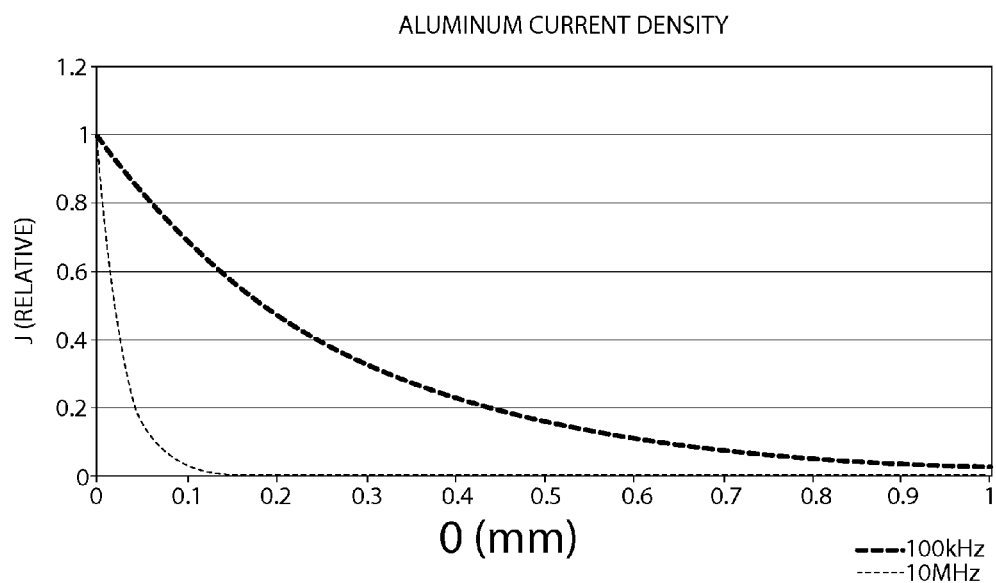
FIG. 5 is a graph showing the current density of currents induced in aluminum at different frequencies.
Figure 6:
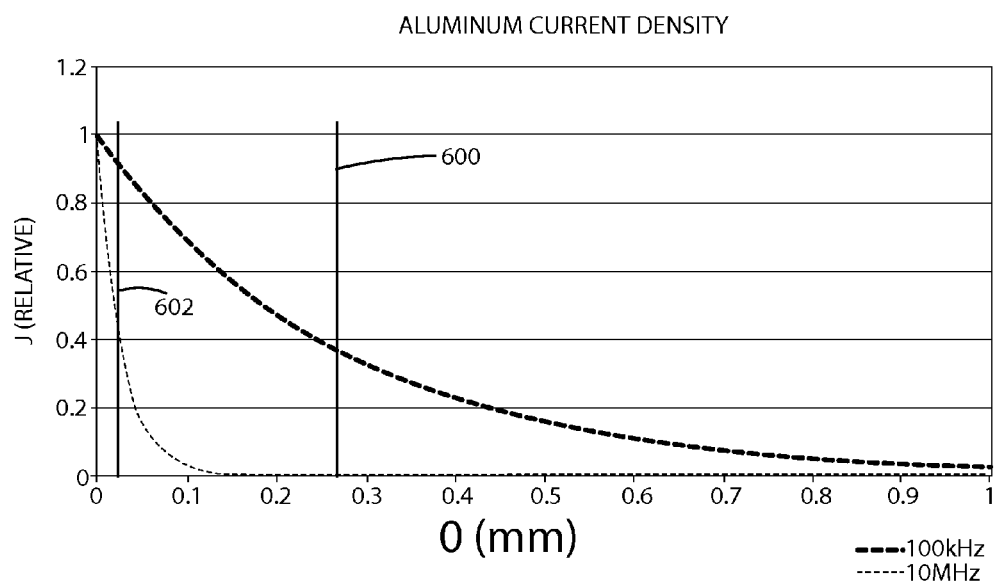
FIG. 6 is a graph used to illustrate the skin depth of aluminum at 100 kHz.

FIG. 4 is representation of the current density within a conductive material 400 placed within proximity to a radiating antenna (e.g. an antenna radiating an electromagnetic field). In this illustration, the current density in the material is represented by the shaded region 402. The height of the shading represents the magnitude of the current density at the corresponding depth in the material. It can be seen that the as the field progresses through the material, more of the energy is absorbed and the field strength, along with the current it induces, are reduced. The field that makes it through the material is reduced in strength when compared to the field entering the conductive material due to the absorption of the conductive material. In other words, the loss in field strength caused by a conductive material is relative to the thickness of the material. It has been determined that the current density induced in a conductive material will typically vary at different frequencies. FIG. 5 shows a current density graph for aluminum at two different frequencies, specifically 10 MHz and 100 kHz. The graph shows current density in Amps per cm$^2$ against distance within the aluminum in millimeters. The current density (J) at a distance (d) within the material is based on the formula:

$$J=J_s e^{-d/\delta}$$

where $J_s$ is the current density at the surface of the material, and δ is the skin depth of the material. FIG. 6 shows a graph of the current density of aluminum at 10 MHz and 100 kHz, and is used to discuss the principle of skin depth. The skin depth of the material is defined as the thickness wherein the current density is reduced to 37% of the density at the surface of the material. Generally speaking, the skin depth is dependant on the properties of the material, and the frequency of the signal. The formula for the skin depth of a material is:

$$\delta = \sqrt{\frac{2*p}{2*\pi*f*\mu}}$$

where p is the resistivity of the material, f is the frequency of the applied signal, and μ is the magnetic permeability of the conductor. It can be seen in this graph that as the frequency is increased, the skin depth of the material becomes smaller, meaning more of the electromagnetic wave (or field) is absorbed closer to the surface of the material. FIG. 6 includes a first vertical line 600 at the skin depth of aluminum at 100 kHz and a second vertical line 602 showing at 1/10 the skin depth of aluminum at 10 MHz.

Figure 7:
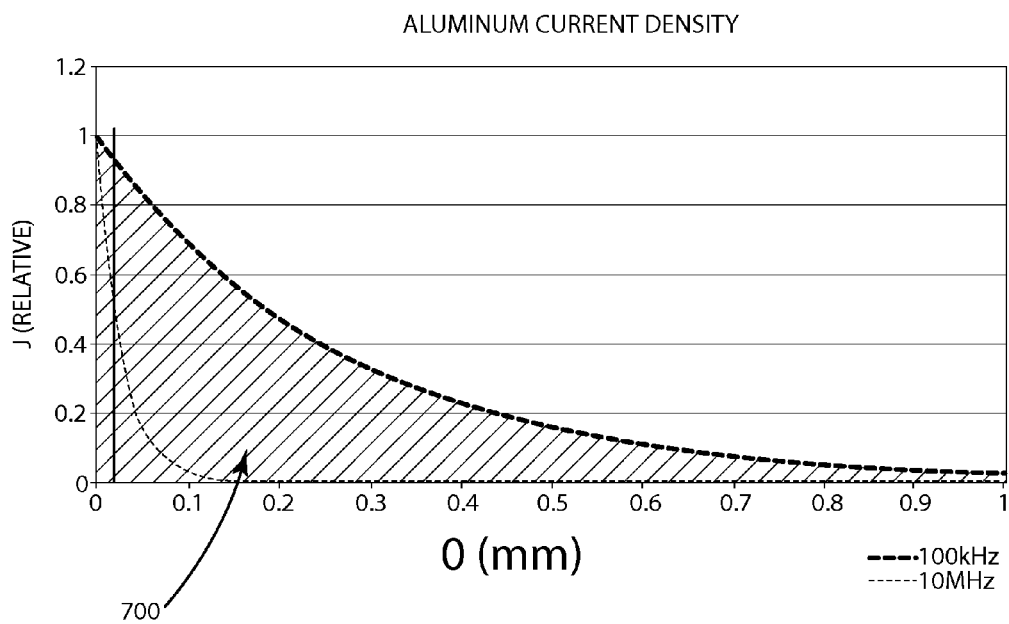
FIG. 7 is a graph showing the total current induced in aluminum 1 mm thick at 100 kHz.
Figure 8:
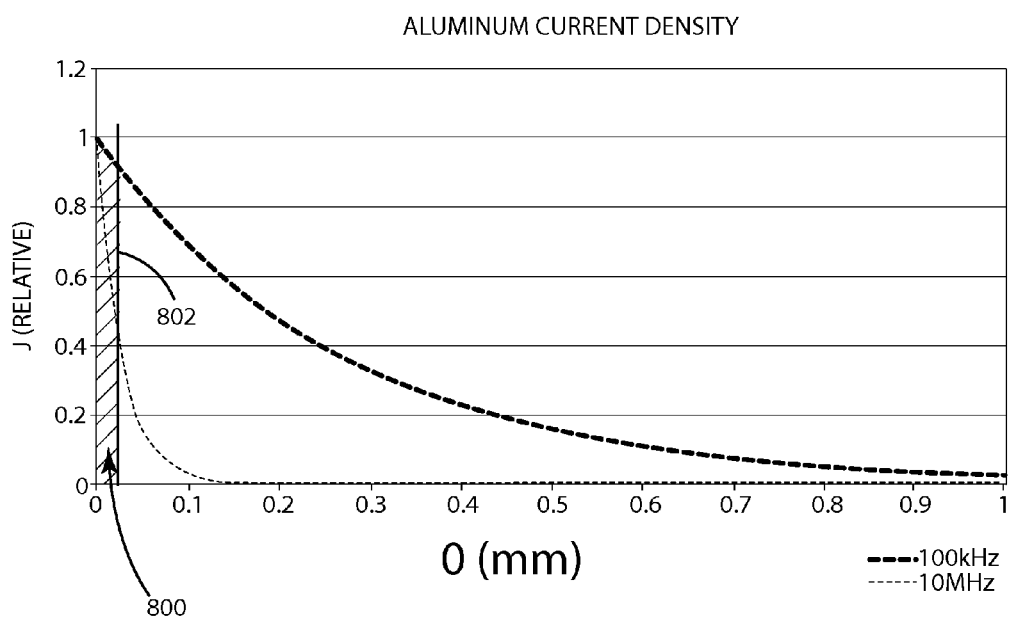
FIG. 8 is a graph showing the total current induced in aluminum that is 1/10th the skin depth thick at 100 kHz.

Referring now to FIGS. 7 and 8, it can be seen that the amount of current absorbed by a material can be reduced by reducing the thickness of the conductive material. FIG. 7 shows the total current induced in a piece of aluminum 1 mm thick when an electromagnetic field is applied at 100 kHz. In this graph, the shaded area 700 under the line represents the total current induced in the aluminum sheet. The shaded area 800 in FIG. 8 shows the total current induced in a piece of aluminum 20 μm thick when an electromagnetic field is applied at 100 kHz. This thickness is selected for illustration purposes because it is approximately 1/10th the skin depth of aluminum. This graph includes a vertical line 802 at the thickness of the aluminum material. In this graph, the shaded area under the current density line and left of the vertical line represents the total current induced in the aluminum material.

As noted above, the present invention typically involves the use of conductive materials that do not exceed about 1/10th the skin depth of the specific conductive material at the anticipated frequency of the electromagnetic field. In applications where the frequency of the electromagnetic field may vary, the thickness of the conductive material may be selected using a variety of different algorithms. For example, the thickness may be selected so that it does not exceed about 1/10th the skin depth at any frequency within the potential range of frequencies. This may result in the use of material that is thinner than might be strictly necessary when at lower frequencies. As another example, the thickness may be selected so that it does not exceed about 1/10th the skin depth at what is expected to be the average frequency of operation, what is expected to be the most commonly used frequency, what frequency is expected to be used when transferring the greatest amount of power, what frequency is expected to be used when transferring the smallest amount of power or some other value based on expected operation of the wireless power supply system.

Figure 9:
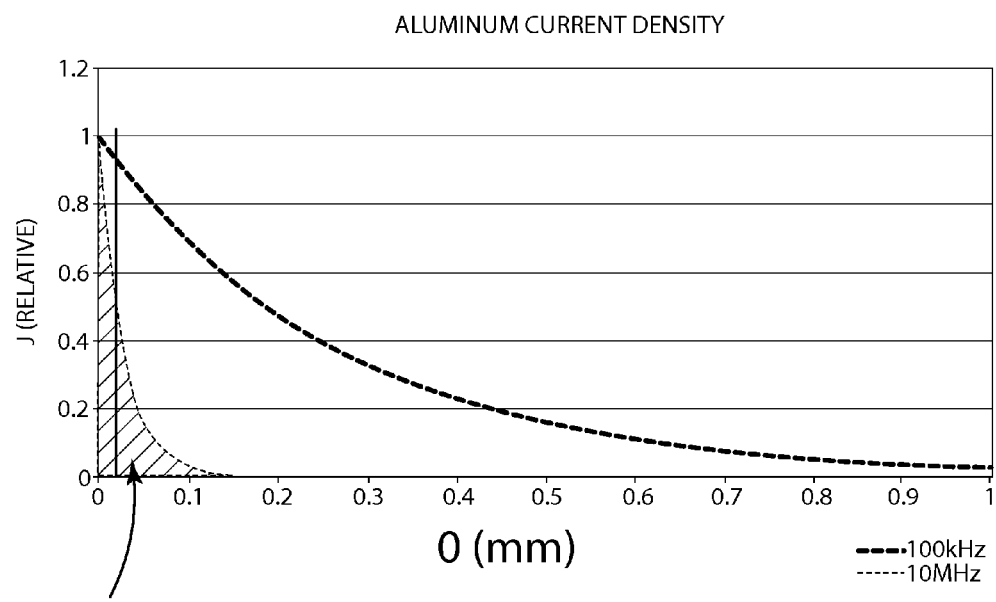
FIG. 9 is a graph showing the total current induced in aluminum 1 mm thick at 10 kHz.
Figure 10:
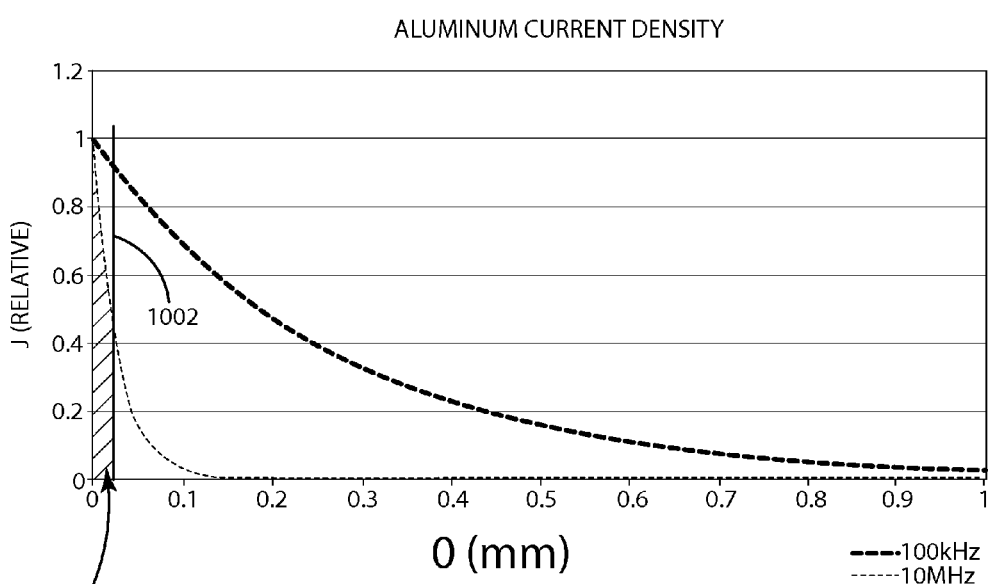
FIG. 10 is a graph showing the total current induced in aluminum that is 1/10th the skin depth thick at 100 kHz when subject to an electromagnetic field at 10 k Hz.

As noted above, the field strength loss in a given material will typically vary by frequency, with higher frequencies resulting in greater field strength losses. For example, FIGS. 9 and 10 are similar to FIGS. 7 and 8, except that they illustrate losses when an electromagnetic field is applied at 10 MHz. FIG. 9 shows the total current induced in a piece of aluminum 1 mm thick when an electromagnetic field is applied at 10 MHz. In this graph, the shaded area 900 under the line represents the total current induced in the aluminum sheet. As can be seen, the 1 mm thick sheet of aluminum will absorb essentially all of the 10 MHz electromagnetic field. FIG. 10 shows the total current induced in a piece of aluminum 20 μm thick when an electromagnetic field is applied at 10 MHz. This graph includes a vertical line 1002 at the thickness of the aluminum material. In this graph, the shaded area 1000 under the current density line and left of the vertical line represents the total current induced in the aluminum material. By comparing FIGS. 8 and 10, it can be seen that the relative total amount of current induced in the 20 μm thick aluminum sheet is substantially greater at 10 MHz than at 100 kHz. This means that a greater portion of the field is absorbed by the 20 μm thick aluminum sheet when the field is at applied at 10 MHz than when it is applied at 100 kHz. For example, this aluminum sheet absorbs over 60% of the applied signal at 10 MHz. It can be seen that as the frequency goes even higher, the amount of absorption continues to increase. This means that a material may be selected to provide a minimum absorption of the wireless power transfer electromagnetic field (100 kHz) while providing a high amount of absorption to frequencies that are undesired at a higher frequency. For example, the 800 MHz band is a cell phone band and the wireless power transmitter would not want to interfere with those frequencies. This piece of aluminum would absorb the energy from the wireless power transmitter at a rate of 99.9%, essentially eliminating any interference signal from the wireless power transmitter.

III. Various Alternative Embodiments

As noted above, the present invention may be implemented in a variety of different electrical components that include conductive materials, but are still capable of being located within the electromagnetic field of a wireless power supply. For example, the electrical component may be used to illuminate a component of the wireless power supply system (such as the wireless power supply, the remote device or an intermediate component), to provide a display in a component of the wireless power supply system, or to provide a component of the wireless power supply system with one or more sensors capable of sensing information useful to the system, such as the presence of a remote device on a wireless power supply power transfer surface or user interaction with the surface. In some embodiments, the electrical component may provide multiple functions, such as being both a display and a sensor. If a multiple function electrical component (e.g. a combined display and sensor) is used outside of the electromagnetic field path of a wireless power supply system, then power loss and heat gain may not be an issue and the conductive materials in the electrical component may have thicknesses that exceed those discussed above.

Electrical components in accordance with the present invention may be located in essentially any location along the electromagnetic field path from the wireless power supply to the remote device. A variety of alternative positions are shown in FIGS. 1-3. FIG. 1 shows the electrical component within the wireless power supply 102. The electrical component includes the conductive material 100 layer positioned over the transmitter coil (e.g. primary coil 106) and below the power transfer surface 104 upon with the remote device 108 is placed. In this embodiment, the electrical component may be connected to the wireless power supply controller (e.g. charging circuitry PCBA 112) by conductive connectors 114 that are sufficiently outside the electromagnetic field path to allow conventional conductor thicknesses. FIG. 2 shows the electrical component on a surface 104 of the wireless power supply 102. As can be seen, the conductive material 100 of the electrical component is disposed on the power transfer surface of the wireless power supply (e.g. charging device 102) over the transmitter coil (e.g. primary coil 106). FIG. 3 shows the electrical component on a surface 105 of a resonating adaptor 109. In this embodiment, the conductive material 100 is positioned on the power transfer surface 105 of the resonating adaptor 109 over the resonating coil 107. The remote device 108 can be placed on and receive power through the conductive material 100. These examples are not intended to be limiting and the electrical component may be located elsewhere along the flow path, such as in/on a remote device 108 or an intermediate component other than a resonating adaptor.

Figure 11:
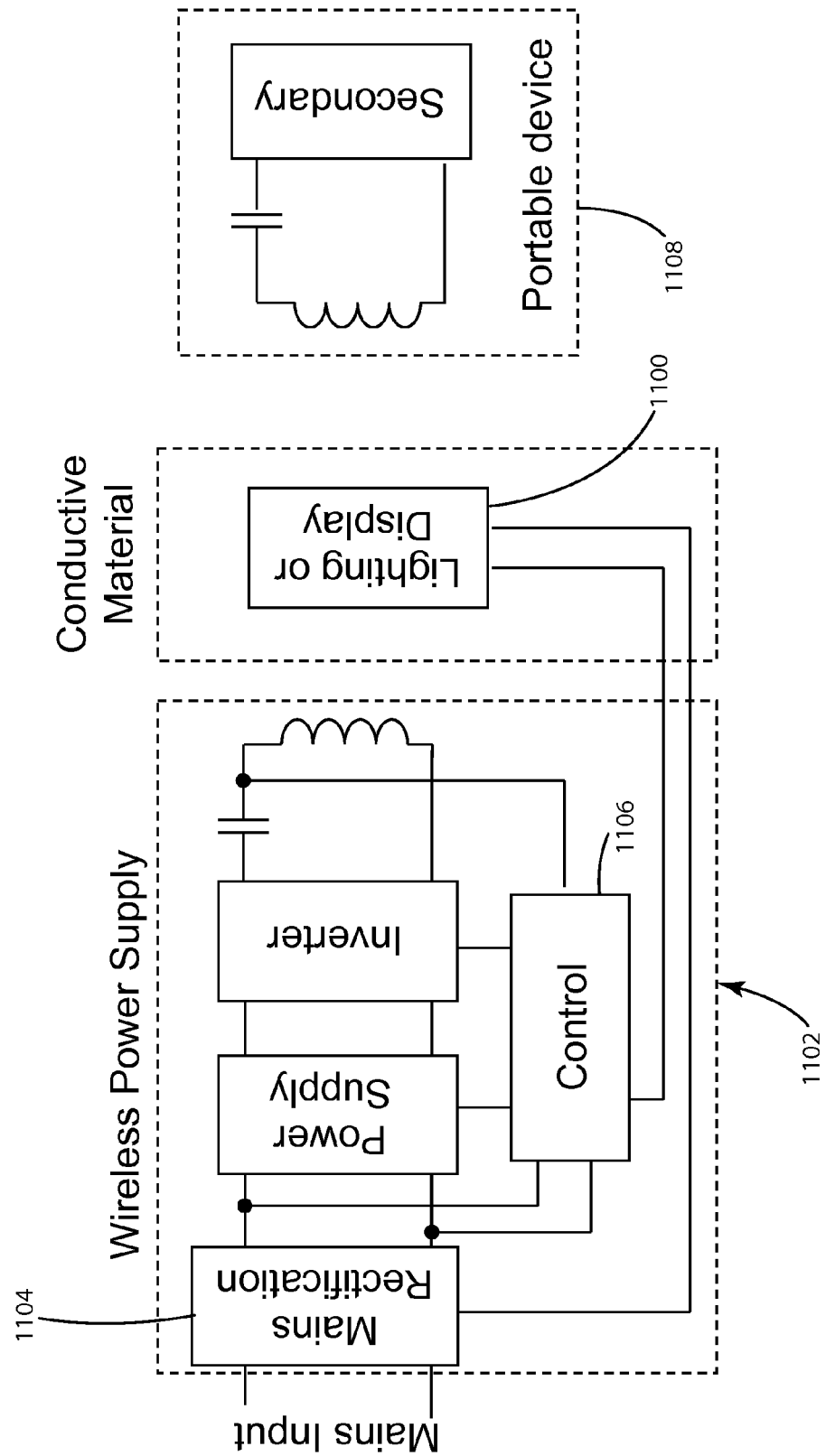
FIG. 11 is a schematic representation of a wireless power supply system in accordance with one embodiment of the present invention.
Figure 12:
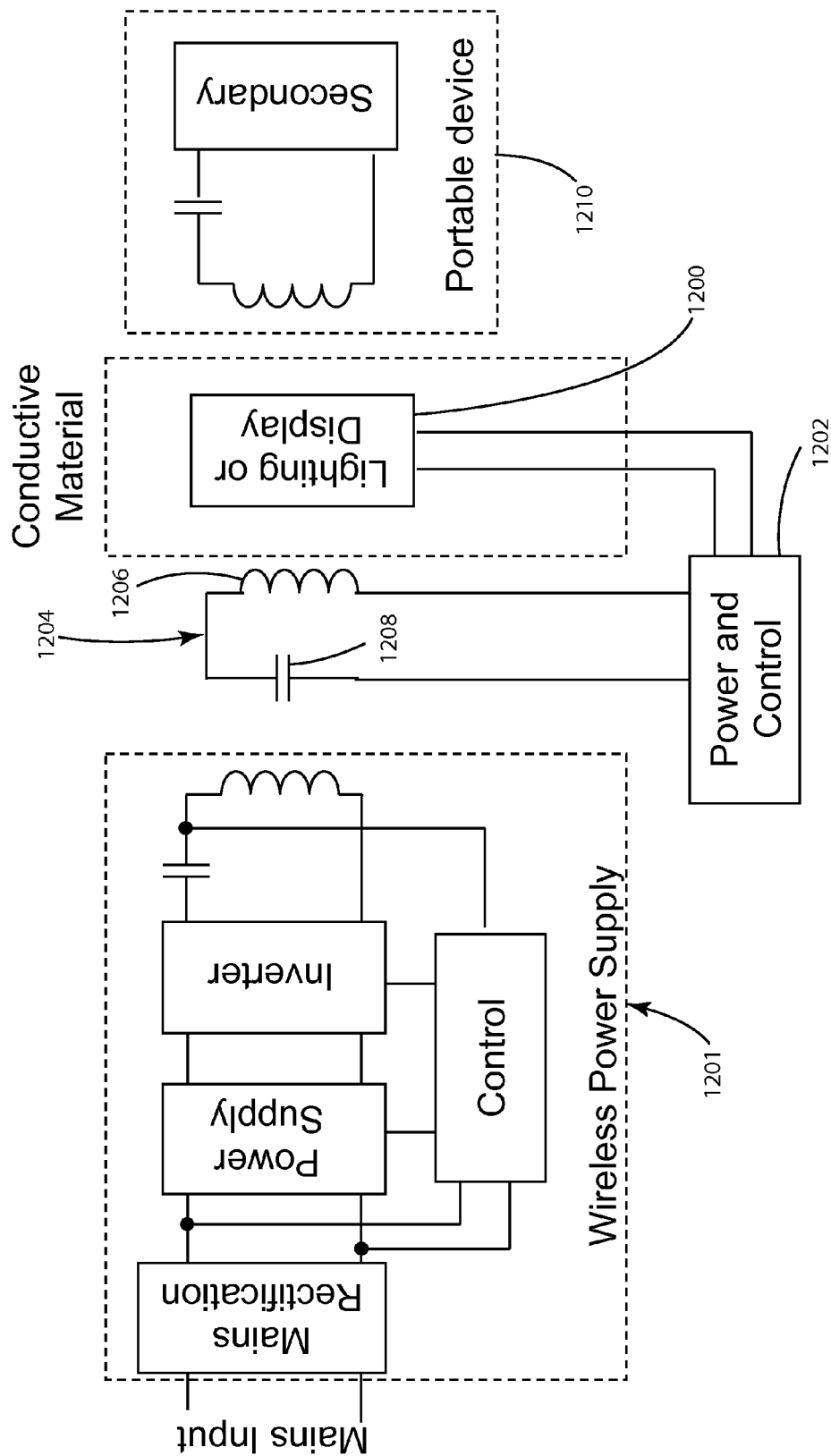
FIG. 12 is a schematic representation of a wireless power supply system in accordance with one embodiment of the present invention.
Figure 13:
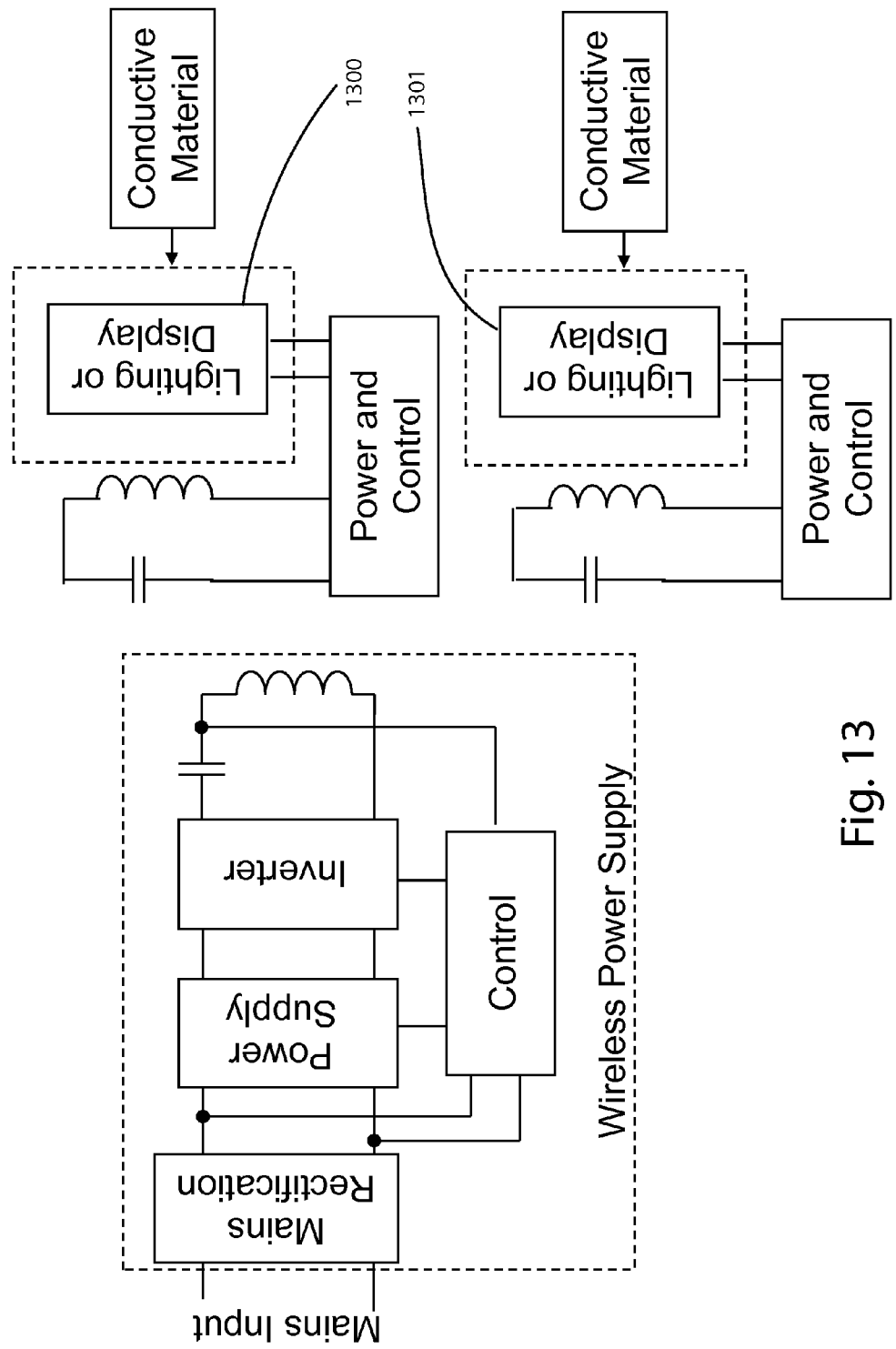
FIG. 13 is a schematic representation of a wireless power supply system in accordance with one embodiment of the present invention.

The present invention provides a variety of alternative systems and methods for providing power and control to the electrical component. For example, FIGS. 11-13 illustrate the general architecture of a variety of alternative systems incorporating the present invention. FIG. 11 is a schematic representation of one embodiment of the present invention in which the electrical component is a display 1100. The term "display" is broadly used to refer to any electrical component capable of selectively providing illumination, images, text, graphics or other visual indicia. The display may be configured to illuminate charging zones, provide directional alignment information, charging status, remote device information or essentially any other visual indication or information that might be desired. In applications where presentation of more detailed information is desired, the display may be more complicated system capable of displaying information using an array of pixels. For example, the display may be an electroluminescent ("EL") display, organic light-emitting diode ("OLED") display or an E-ink display. In the embodiment shown in FIG. 11, the display containing conductive materials is incorporated into the wireless power supply 1102. For example, the display may be disposed beneath, within or on the power transfer surface of the wireless power supply. In this embodiment, the display receives power and control signals from the wireless power supply. As shown in FIG. 11, the wireless power supply 1102 may include a mains rectifier 1104 that provides power for the wireless power supply and for the display. The wireless power supply 1102 may also include a controller 1106 that controls operation of the wireless power supply and controls operation of the display 1100. The controller 1106 may be configured and programmed to illuminate the display 1100 in accordance with essentially any desired operating scheme. For example, the controller may be configured and programmed to illuminate the display when a remote device is within sufficient proximity to the wireless power supply. In this example, if the remote device (e.g. portable device 1108) and wireless power supply 1102 have a mechanism for communicating with one another (such as a medium range communication system like Bluetooth, WiFi or other short wave radio sources), the remote device and wireless power supply may communicate when they are in sufficient proximity. If a medium range communication system is not present, the wireless power supply may use other techniques to recognize when a remote device is present, such as through the use of a proximity sensor, the periodic transmission of a "ping" or user-actuated switch.

As another example, the controller 1106 may be configured to illuminate different portions of the display to provide assistance in aligning the remote device with the wireless power supply transmitter. These portions of the display may be shaped to provide visual clues concerning movement of the remote device, such as arrows. In such embodiments, the wireless power supply may incorporate an array of sensors capable of determining the position of the remote device on the power transfer surface. For example, the wireless power supply may include a capacitive sensor array or a pressure-sensitive sensor array in accordance with an embodiment of the present invention, as discussed in more detail below.

In the alternative embodiment shown in FIG. 12, the display has integrated power and control facilities. In this embodiment, the display 1200 is incorporated into an assembly having an integrated wireless power receiver capable of receiving power from the electromagnetic field of the wireless power supply 1201. The electrical component of FIG. 12 also includes a display controller 1202 that handles power and control facilities and is capable of operating on power received by the wireless power receiver 1204. The wireless power receiver may include a tank circuit having an inductor 1206 and a capacitor 1208. The power receiver 1204 may be configured to receive only a portion of the energy available in the electromagnetic field so that sufficient power remains in the electromagnetic field to provide power to the remote device(s) 1210. The amount of power available for use by display may vary from application to application depending, for example, on the power output capabilities of the wireless power supply and the power consumption characteristics of the remote device. In this embodiment, the power and control facilities may include a rectifier to rectify the AC power induced in the tank circuit to provide DC power for the controller and the display. The controller may be configured to operate the display in accordance with internal programming using power generated by the integrated wireless power receiver. The integrated power and control facilities may include a battery or other electrical energy storage device, such as a capacitor, if desired.

In another alternative embodiment shown in FIG. 13, the system may include a plurality of displays 1300, 1301, each with integrated power and control facilities similar to the embodiment of FIG. 12. In this embodiment, the two displays may be capable of operating independently of one another. This may be particularly useful when it is desirable to selectively place different electrical components on a wireless power supply, such as placing multiple resonating adaptors on the power transfer surface of a single wireless power supply.

This description will now turn from system architecture to the construction of various alternative electrical components with integrated conductive materials. For purposes of disclosure, the present invention will be described in connection with a variety of alternative embodiments that include one or more conductive pads capable of operating alone or in combination with other components to perform a function, such as illumination, display or sensing. In those various embodiments that include a single layer of conductive material, that single layer of conductive material may be not substantially thicker than about 1/10th the skin depth of the conductive material at the anticipated electromagnetic field frequency. As noted above, that is approximately 20 μm thick for an aluminum sheet subjected to a 100 kHz electromagnetic field. In some embodiments, the functional electrical component includes more than one layer of conductive materials. In such embodiment, the thicknesses of the various layers are selected so that the combined loss of all of the layers does not result in a loss greater than would result from a material that was about 1/10th of the skin depth at the appropriate frequency. For example, an electroluminescent display in accordance with one embodiment of the present invention includes two conductive layers, and the thicknesses of these two layers may be selected so that the sum of their individual skin depths does not substantially exceed about 1/10th the skin depth at the frequency of the wireless power supply. For example, to illustrate this concept, if a first material is about 0.7/10 the skin depth of that first material, then the second material can be up to about 0.3/10 the skin depth of that second material.

Figure 15:
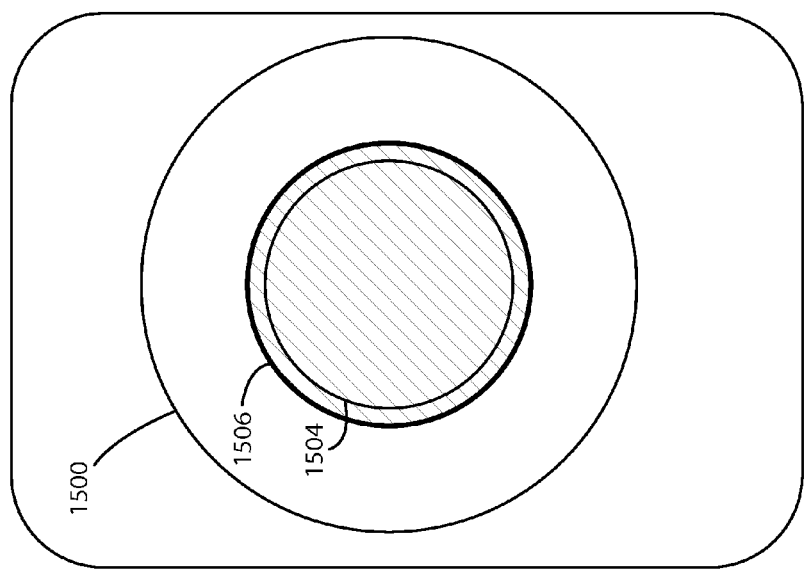
FIG. 15 is a schematic representation of an alternative embodiment having an aperture.
Figure 14:
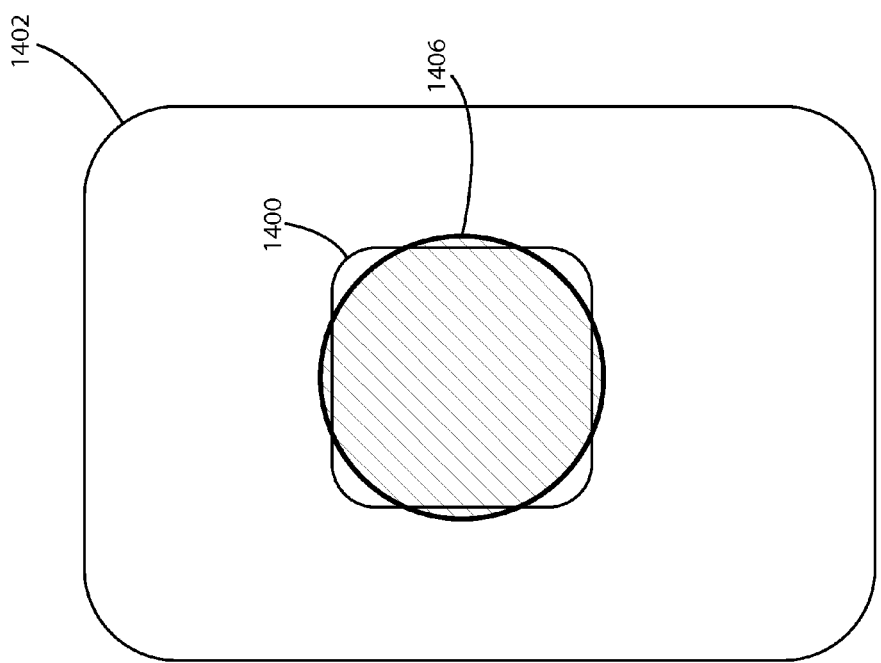
FIG. 14 is a schematic representation of a conductive pad disposed on a power transfer surface adjacent a power transmitter coil.
Figure 16:
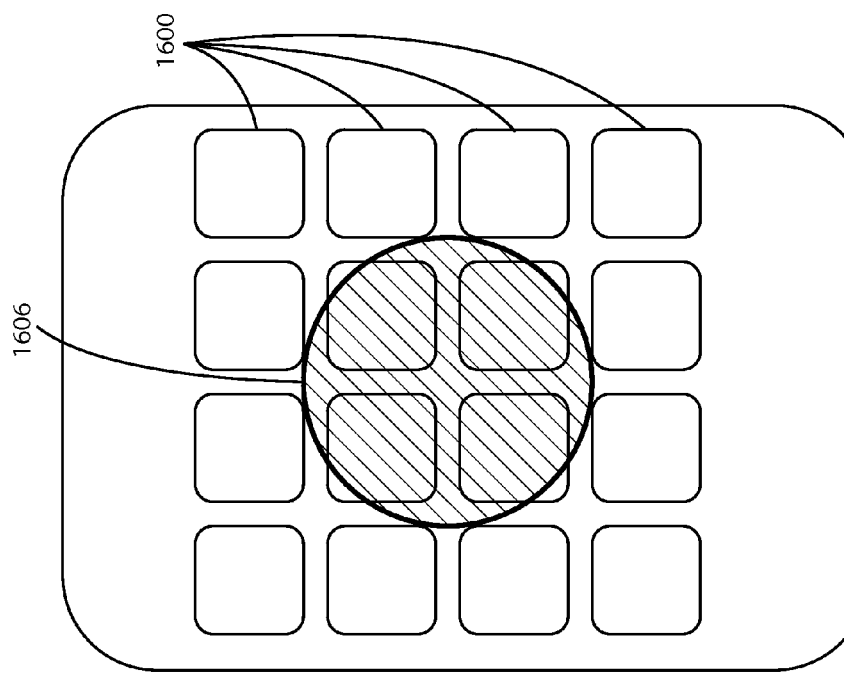
FIG. 16 is a schematic representation of a plurality of conductive pads disposed on a power transfer surface adjacent a power transmitter coil.

The size, shape and position of the conductive pad(s) (or other conductive materials) with respect to the wireless power transmitter may vary from application to application. FIGS. 14-16 are examples of various potential arrangements. The examples of FIGS. 14-16 are provided to illustrate the breadth of the present invention are not intended to be an exhaustive presentation of all potential arrangements. FIG. 14 shows an embodiment in which an electrical component includes a conductive pad (e.g. conductive area 1400) disposed on a power transfer surface (e.g. wireless transmitting pad 1402) adjacent the wireless power transmitter (e.g. primary coil 1406) in the wireless power supply. In this embodiment, the conductive pad 1400 overlays the primary coil 1406 and may be part of a sensor, display, lighting or other circuitry, or any combination of thereof. As can be seen, the conductive pad overlays a majority of the underlying transmitter.

FIG. 15 shows an alternative embodiment in which the conductive pad 1500 includes an aperture 1504 to reduce the amount of eddy currents (and consequently reduce power loss and heat gain). The aperture may be located in essentially any location in the conductive pad, but may be most beneficial if defined in a region where the magnetic flux is highest. In the embodiment of FIG. 15, the conductive pad 1500 is disposed concentrically over the wireless power transmitter 1506 and the aperture 1504 is formed in the center of conductive pad 1500, thereby forming a ring of conductive material.

Figure 17:
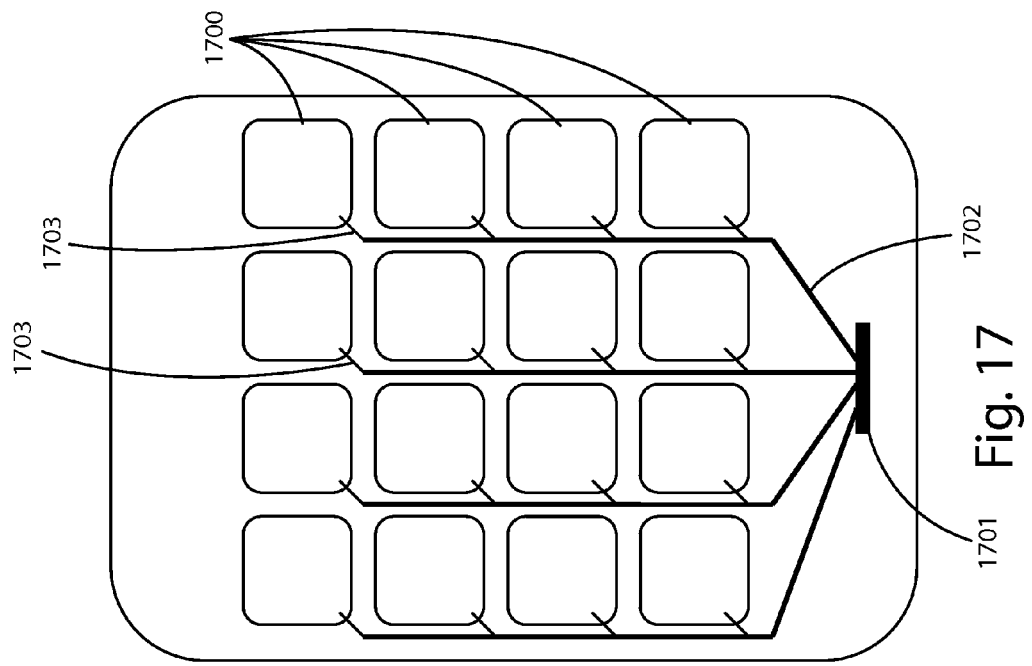
FIG. 17 is a schematic representation of a plurality of conductive pads disposed on a power transfer surface adjacent a power transmitter coil illustrating the routing of signals.
Figure 18:
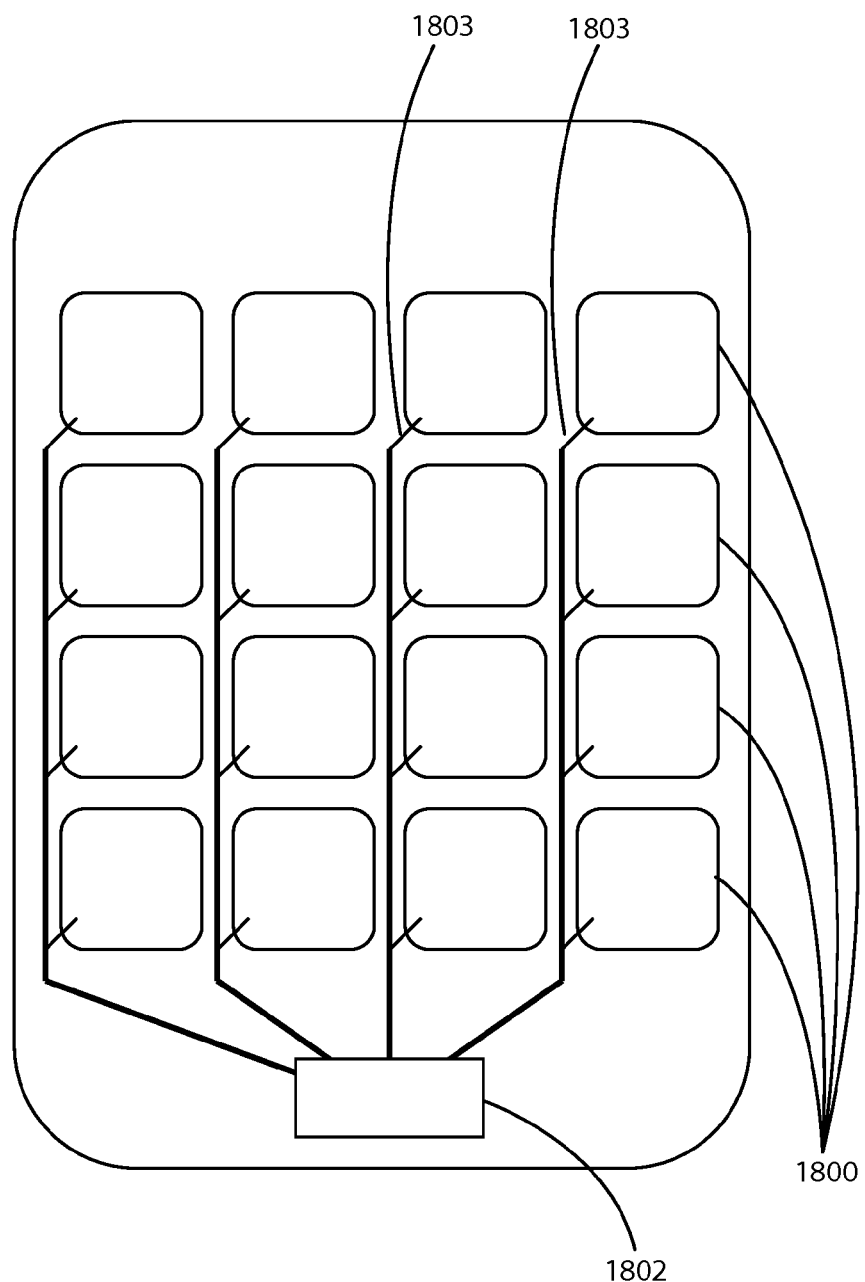
FIG. 18 is a schematic representation of a plurality of conductive pads disposed on a power transfer surface adjacent a power transmitter coil illustrating the routing of signals.

FIG. 16 shows another alternative embodiment in which the electrical component includes a plurality of conductive pads (e.g. conductive areas 1600) arranged in an array adjacent to the wireless power transmitter (e.g. primary coil 1606). In this embodiment, each one of the conductive pad 1600 may be part of a sensor, display, lighting or other circuitry, or any combination of thereof. Each of the conductive pads 1600 is individually electrically connected to the controller. These individual connections allow the conductive pads to be operated individually. For example, when the electrical component is a display, the controller is capable of individually illuminating or otherwise activating each conductive pad. As another example, when the electrical component is a sensor, the controller is capable of individually measuring the signals at each conductive pad. The measured characteristic may vary from application to application depending on the type of sensor. With a capacitive sensor, the controller may be measuring characteristic(s) indicative of the capacitance at each conductive pad. With a pressure-sensitive sensor, the controller may be measuring a characteristic(s) indicative of the voltage developed across the piezoelectric material. Although this embodiment shows a plurality of conductive pads separately connected to a controller, in some applications is may be desired to collectively connect two or more conductive pads to the controller so that those conductive pads can be operated together by the controller. For example, in the context of an illuminated display, it may be desirable to collectively connect a plurality of different conductive pads to the controller when it is desirable to always illuminate the regions associated with the different conductive pads at the same time. FIG. 17 shows one structure for routing signals from each of the conductive pads 1700 to a signal bus 1702 and eventually to a connector 1701. The conductive leads 1703 used in routing signals are, in this embodiment, no thicker than the conductive pads. In applications where the electrical component receives power and control signals from the wireless power supply, the connector may connect to the controller of the wireless power supply, for example, to the wireless power supply PCB assembly. The connector 1701 may be essentially any type of electrical connector capable of electrically connecting the electrical component to the wireless power supply. FIG. 18 is an alternative embodiment in which the conductive pads 1800 are connected to a dedicated controller 1802 rather than the controller of the wireless power supply. In this embodiment, the conductive leads 1803 used to route the signals are no thicker than the conductive pads. The electrical component and its associated controller may be manufactured on one assembly where the conductive pads and conductive leads are copper fill areas on a PCB, or materials added directly to the PCB assembly to provide the conductive areas.

Figure 19:
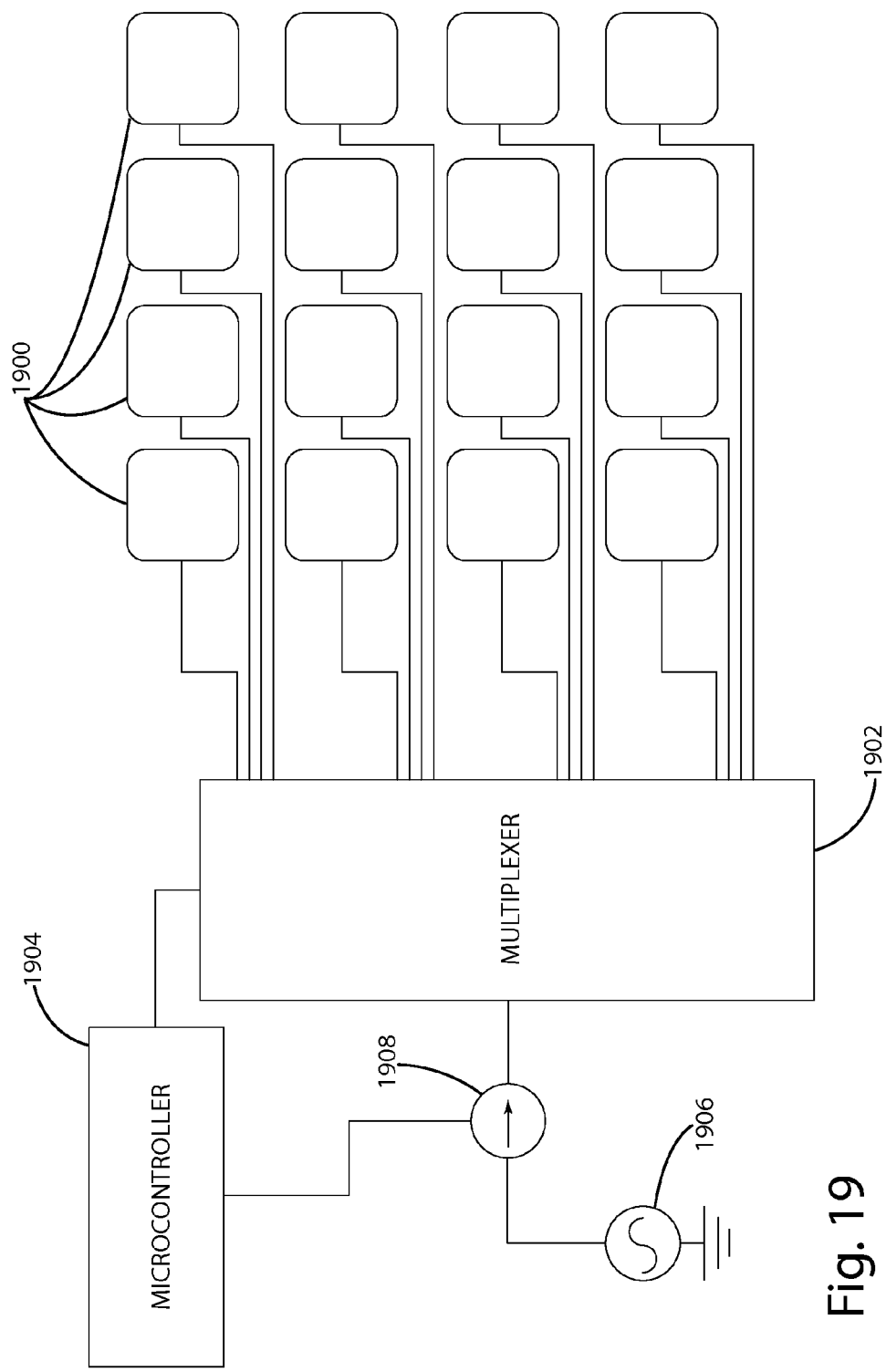
FIG. 19 is a schematic representation of a plurality of conductive pads in an alternative embodiment.

As an alternative to having separate conductive leads electrically connecting each conductive pad to the controller, the system may include a multiplexer for selectively connecting any individual conductive pad to the controller. FIG. 19 is a schematic representation of an electrical component system that includes a controller (e.g. microcontroller 1904) and a multiplexer 1902. As noted above, the controller 1904 may be the controller of the wireless power supply or a separate controller dedicated to operating the electrical component. Also as noted above, the power input 1906 for this embodiment may come from the wireless power supply or may be a separate power supply dedicated to supplying power to the electrical component system, such as a separate wired power supply or a wireless power receiver that receives power from the electromagnetic field generated by the wireless power supply. In this embodiment, the electrical component is a capacitive sensor having a plurality of separate conductive pads 1900 arranged in a regular pattern. In this embodiment, the controller 1904 is connected to and operates multiplexer 1902. For example, the controller 1904 may cause the multiplexer to sequentially connect the multiplexer input to each individual conductive pad 1900 to sequentially vary the active conductive pad. The timing and pattern for cycling through the conductive pads may vary from application to application. For example, the controller may repeatedly and continuously cycle the active conductive pads, or it may periodically cycle through the conductive pads with a delay between each cycle. In this embodiment, the electrical component includes a sensor connected to the input of the multiplexer. The input sensor 1908 is configured to sense a characteristic of power, such as voltage and/or current, that is indicative of the status of each conductive pad. For example, with a capacitive sensor, the input sensor may measure current or voltage to determine the capacitance of the active conductive pad (i.e. the conductive pad currently coupled to the multiplexer input).

Figure 20:
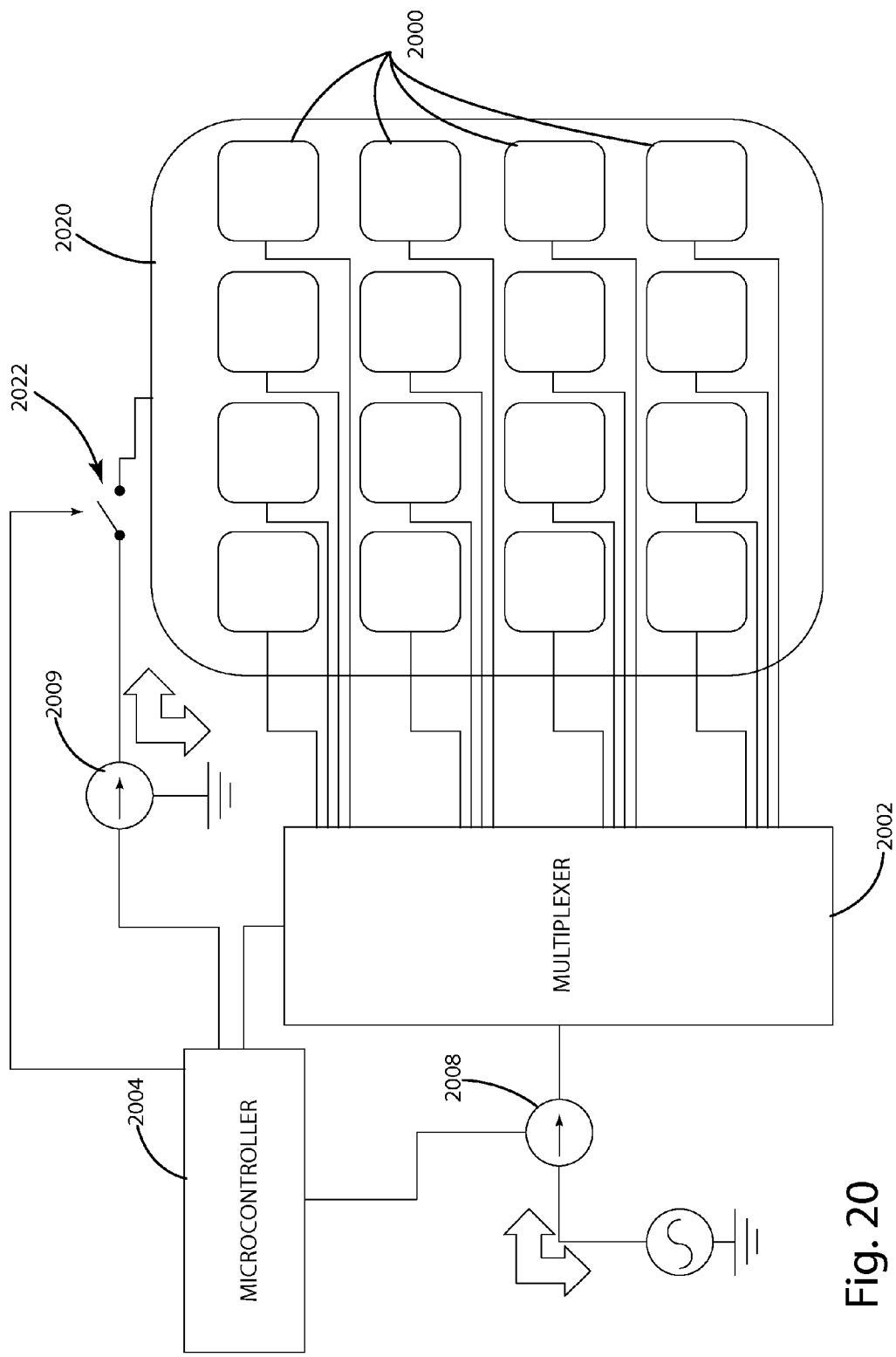
FIG. 20 is a schematic representation of a plurality of conductive pads in another alternative embodiment.

FIG. 20 is a schematic representation of an alternative electrical component system having a multiplexer 2002. In this embodiment, the system also includes a ground plane 2020. The ground plane 2020 is included to provide a return path. In this embodiment, the conductive pads 2000 and ground plane 2020 may be components of a display and/or a sensor. For example, the conductive pads 2000 may form one electrode of a display and/or a sensor, and the ground plane 2020 may form the other electrode of the display and/or sensor. The appropriate intermediate materials may be disposed between the electrodes, such as an electroluminescent material when the electrical component is an electroluminescent display or a piezoelectric material when the electrical component is a pressure sensitive sensor. In this embodiment, the return line from the ground plane 2020 may include a switch 2022 that permits the controller 2004 to selectively disconnect the ground 2020 for applications where ground is used for some purposes, but not others. For example, when the electrical component is capable of operating in one mode as an electroluminescent display and in another mode as a capacitive sensor, it may be desirable to disconnect the ground plane 2020 when in the capacitive sensor mode. In this embodiment, the electrical component system may include an input sensor 2008 in the power input line to the multiplexer 2002 and/or a return sensor 2009 in the return line from the ground plane. The input sensor and return sensor may be used alone or in combination to measure a characteristic of power associated with the active conductive pad. For example, the controller may determine the state of a sensor based on current measurements made by the input sensor 2008, current measurements made by the return sensor 2009 and/or a comparison of current measurements made by the two sensors.

Figure 21:
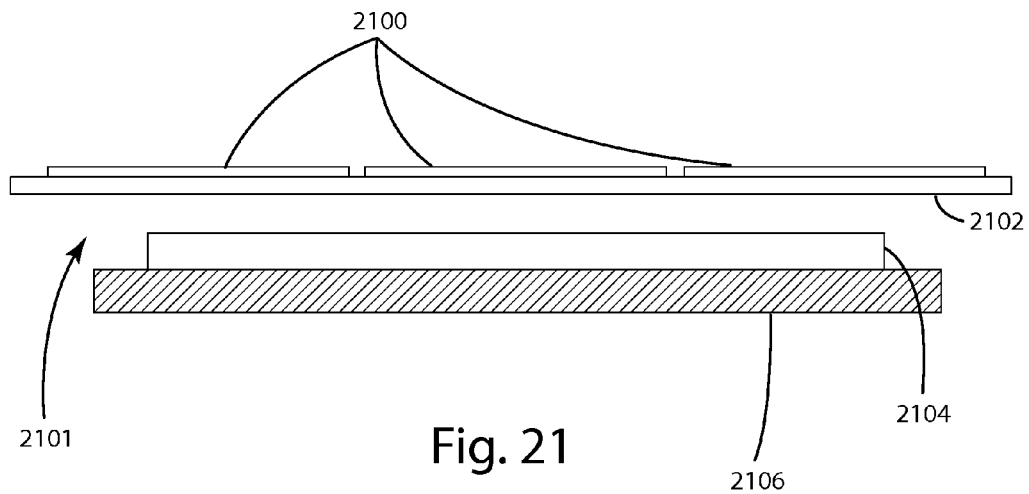
FIG. 21 is a sectional view showing an embodiment of the present invention in which conductive pads function as a capacitive sensor array.

As previously noted, the type of electrical component may vary from application to application. For example, the electrical component may be a display to illuminate or provide visual indicia on a component of the wireless power supply system (such as the wireless power supply, the remote device or an intermediate component) or a sensor/sensor array capable of sensing information useful to the system (such as the presence of a remote device on a wireless power supply power transfer surface or user interaction with the surface). In some embodiments, the electrical component may provide multiple functions, such as being both a display and a sensor. Although the configuration of the electrical component may vary, FIGS. 21-26 show various exemplary embodiments for different types of electrical components. These examples are intended to illustrate the breadth of the invention and should not be interpreted to limit the scope of the present invention. FIG. 21 is a sectional representation of a wireless power transmitter 2101 that includes a plurality of conductive pads 2100 configured to operate as a capacitive sensor array. In this embodiment, the array includes three conductive pads 2100 in the direction along which the sectional view was taken. The number of conductive pads may vary from application to application. In this embodiment, the conductive pads 2100 are formed on a substrate 2102 capable of properly supporting the thin conductive materials. Although not shown, the electrical component will also include conductive leads for electrically connecting the conductive pads to the controller or to a multiplexer, as described above in connection with FIGS. 17 and 18. The conductive pads and conductive leads may be formed using essentially any techniques and apparatus capable of forming sufficiently thin materials. For example, the conductive pads and leads may be formed by sputter coating or by silk screening the conductive material onto the substrate. As shown, the electrical component may be positioned over a transmitter, such as a transmitter coil (e.g. TX coil 2104). A shielding or flux guide material (e.g. TX shield 2106) may be positioned below the transmitter coil 2104 to limit stray fields.

Figure 22:
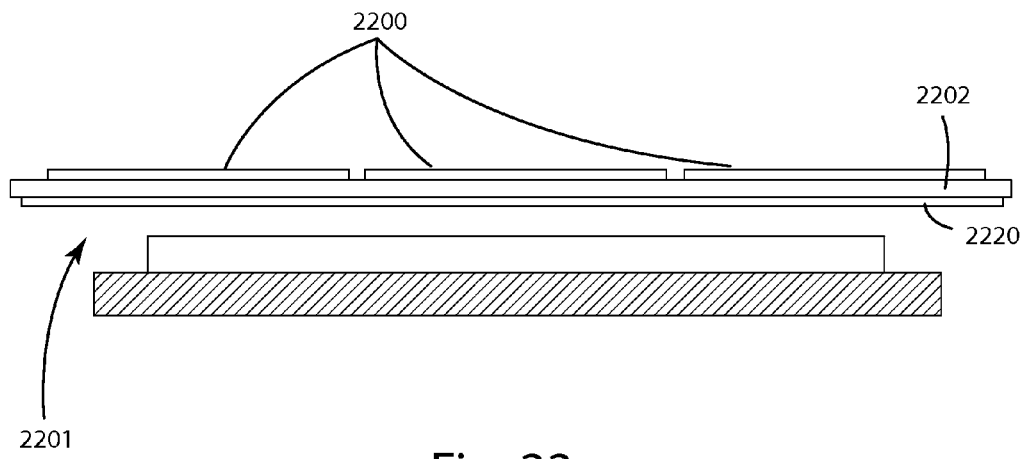
FIG. 22 is a sectional view showing another embodiment of the present invention in which conductive pads and a ground plane function as a capacitive sensor array.

FIG. 22 is a sectional representation of a wireless power transmitter 2201 that includes a plurality of conductive pads 2200 and a ground plane 2220 configured to operate as a capacitive sensor array. In this embodiment, any one of the conductive pads may combine with the ground plane to form a pair of electrodes. As with the embodiment of FIG. 21, this embodiment includes an array having three conductive pads 2200 in the direction along which the sectional view was taken. The number of conductive pads may vary from application to application. In this embodiment, the conductive pads 2200 are formed on one side of a substrate 2202 capable of properly supporting the thin conductive materials, and the ground plane 2020 is formed on the opposite side. Alternatively, the conductive pads may be formed on a different substrate than the ground plane. Although not shown, the electrical component will also include conductive leads for the conductive pads and the ground plane. The conductive pads, ground plane and conductive leads may be formed using essentially any techniques and apparatus capable of forming sufficiently thin materials, such as sputter coating or by silk screening. As shown, the electrical component may be positioned over a transmitter, such as a transmitter coil. A shielding or flux guide material may be positioned below the transmitter coil to limit stray fields. In this embodiment, the total thickness of both the ground plane and the conductive pads above said ground plane would together be not substantially thicker than about 1/10 the skin depth of the material. In the case that these materials are two different materials, the sum of their thicknesses would be taken in terms of their individual skin depths. For example, to illustrate this concept, if a first material is 0.7/10 the skin depth of that first material, then the second material can be up to about 0.3/10 the skin depth of that second material.

In some applications, the switching noise from the inductive power supply may inhibit the effectiveness of a capacitive sensing array since the coil is located directly below the array. To mitigate this, a ground plane may be located below the array to absorb radiated energy at the frequency of the capacitive sensor as shown in FIG. 22. For effectiveness in typical applications, the frequency of the capacitive sensor may be on the order of 20 times higher than the frequency of the wireless power supply, so that the ground plane can be made about 1/20 the thickness of the skin depth at the inductive power supply frequency (as well as the capacitive sense pad). At this thickness, the ground plane is effectively at the skin depth of the capacitive sensor frequency, providing approximately 36% reduction (or more) in radiated energy at that frequency. When the ground plane is located below the capacitive sensor, it may be desirable for the distance between the capacitive sense pad and the ground plane to be greater than the distance between the capacitive sense pad and the surface of the transmitter, so that the effect of placing an object on the surface of the transmitter provides a greater delta in effective capacitance of the pad.

Figure 23:
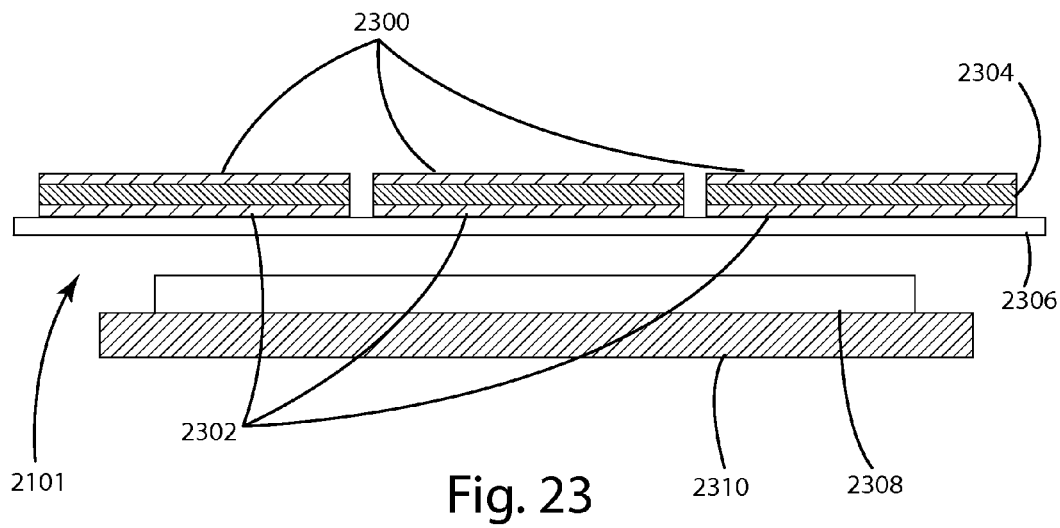
FIG. 23 is a sectional view showing another embodiment of the present invention in which conductive pads and a piezoelectric material function as a sensor array.

FIG. 23 is a sectional representation of a wireless power transmitter 2301 and an electrical component configured to function as a pressure-sensitive sensor array. In this embodiment, the electrical component includes a first plurality of conductive pads 2300 in a first plane and a second plurality of conductive pads 2302 in a second plane. The two sets of conductive pads sandwich a piezoelectric material 2304. The piezoelectric material is selected to produce a voltage across their structure when deformed by a force. In any given application, the piezoelectric material is selected and configured to be sensitive to the amount of force intended to be sensed in that application. For example, in this embodiment, the piezoelectric material 2304 is selected and configured to be of appropriate sensitivity to recognize when a remote device, such as a cell phone is placed on the surface of the electrical component (e.g. on top of the conductive pads 2300, 2302). This embodiment includes an array having conductive pads 2300, 2302 in the direction along which the sectional view was taken. The number of conductive pads 2300, 2302 may vary from application to application. In this embodiment, both sets of conductive pads are formed on one side of a substrate 2306 capable of properly supporting the thin conductive materials. Although not shown, the electrical component will also include conductive leads for the conductive pads. The conductive pads and conductive leads may be formed using essentially any techniques and apparatus capable of forming sufficiently thin materials, such as sputter coating or by silk screening. As shown, the electrical component may be positioned over a transmitter, such as a transmitter coil 2308. A shielding or flux guide material 2310 may be positioned below the transmitter coil 2308 to limit stray fields. In this embodiment, the total thickness of the both conductive pads above and below the piezoelectric material would together be not substantially thicker than about $1/10$ the skin depth of the material. In the case that these materials are two different materials, the sum of their thicknesses would be taken in terms of their individual skin depths. For example, to illustrate this concept, if a first material is 0.7/10 the skin depth of that first material, then the second material can be up to about 0.3/10 the skin depth of that second material. In this embodiment, the piezoelectric material is a non-conductive material, meaning that it would not absorb the electromagnetic field. If a conductive piezoelectric material is used, it would be factored in when determining acceptable material thicknesses.

In another embodiment, the present invention combines an electroluminescent display with a capacitive sensor array. In these embodiments, an area of electroluminescent material is also used as a capacitive sensor. When it is desired to use the area as a capacitive sensor without lighting that area, the controller may apply a voltage or current that is either not high enough in power to light the material, or is at an operating frequency substantially different than the frequency at which the material illuminates, or it may disconnect the ground plane of the material eliminating the return path for current, or any combination thereof. Once it is determined the material should be illuminated (either due to proximity, to provide user feedback or for some other reason), the controller will provide enough power at the correct operating frequency to illuminate the material, or reconnect the ground plane of the material, or both. Once the material is illuminated, the controller will measure the characteristics of the voltage and current to determine if a capacitive material has been placed in proximity. This can be done by inferring a change in the resonant frequency of the circuit, the difference in input and return current, or simply by measuring a shift in the amplitude or phase of the voltage or current. This can also be done by placing an additional area of conductive material near to the illuminated area and measure the coupled voltage or current into that conductive area.

The controller may also periodically disconnect the ground return of the material for a period of time short enough to prevent a noticeable dimming of the material, but long enough for the controller to measure the effective current, voltage or capacitance of the conductive areas. Once a measurement is taken, the controller determines whether or not to switch to a different conductive area, to take another measurement, or to simply stop illuminating the surface by leaving the ground plane disconnected.

Figure 24:
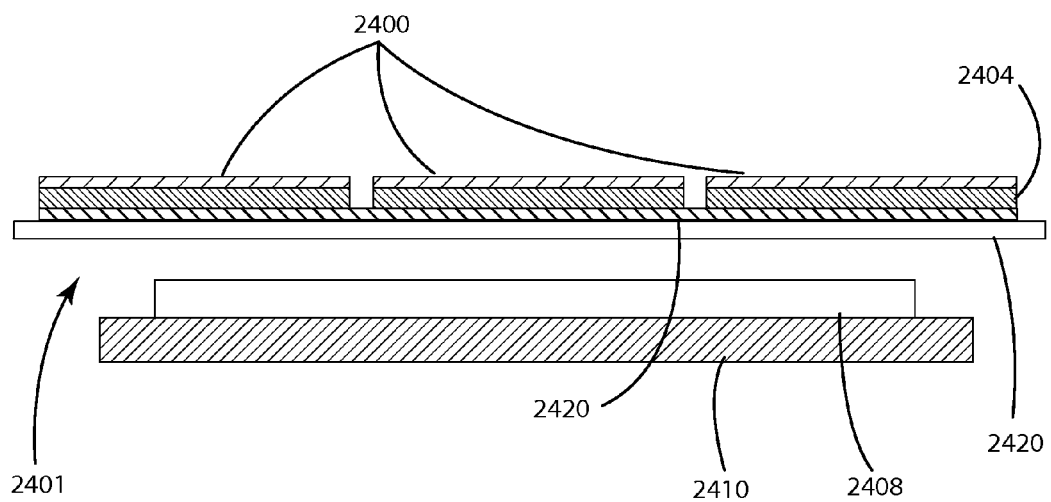
FIG. 24 is a sectional view showing another embodiment of the present invention in which conductive pads and electroluminescent material function to provide illumination and a capacitive sensor array.

FIG. 24 is a sectional representation of a wireless power transmitter 2401 that includes a plurality of conductive pads 2400 and a ground plane 2420 configured to operate as an electroluminescent display and a capacitive sensor array. In this embodiment, any one of the conductive pads 2400 may combine with the ground plane 2420 to form a pair of electrodes. In this embodiment, an electroluminescent material 2404 is sandwiched between each conductive pad 2400 and the ground plane 2420. In this embodiment, the conductive pads 2400 may be formed from a transparent or translucent conductive material so that the illuminated electroluminescent is visible through the conductive pads. A variety of transparent and translucent materials are known to those skilled in the field, such as indium tin oxide ("ITO"), fluorine doped tin oxide ("FTO"), doped zinc oxide and other transparent conductive oxides ("TCOs"). In use, controller is capable of operating the electrical component in an EL mode or a capacitive sensor mode. In the EL mode, the controller may apply AC power to the conductive pad(s) covering the region(s) where illumination is desired. The electroluminescent materials between the conductive pad(s) receiving AC power and the ground plane will illuminate when an alternating magnetic field is applied across the material. In the capacitive sensor mode, the controller may sense for conductive items within proximity of the conductive pads by applying power to the conductive pads and measuring the current and/or voltage. The controller may disconnect the ground plane when in the capacitive sensor mode, if desired. As with the embodiment of FIG. 21, this embodiment includes an array having three conductive pads in the direction along which the sectional view was taken. The number of conductive pads may vary from application to application. In this embodiment, the conductive pads, electroluminescent material and ground plane are formed on one side of a substrate 2406 capable of properly supporting the various materials. Although not shown, the electrical component will also include conductive leads for the conductive pads and the ground plane. The conductive pads, ground plane and conductive leads may be formed using essentially any techniques and apparatus capable of forming sufficiently thin materials, such as sputter coating or by silk screening. As shown, the electrical component may be positioned over a transmitter, such as a transmitter coil 2408. A shielding or flux guide material 2410 may be positioned below the transmitter coil to limit stray fields. In this embodiment, the total thickness of both the ground plane and the conductive pads above said ground plane would together be not substantially thicker than about $1/10$ the skin depth of the material. In the case that these materials are two different materials, the sum of their thicknesses would be taken in terms of their individual skin depths. In this embodiment, the electroluminescent material is a non-conductive material and is therefore not relevant in determining acceptable material thicknesses.

Figure 25:
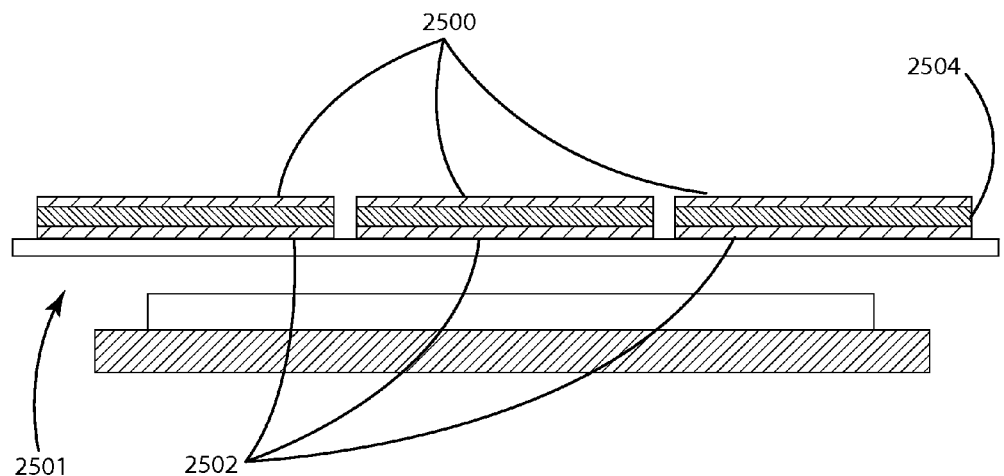
FIG. 25 is a sectional view showing another embodiment of the present invention in which conductive pads and a pressure resistive material function as a sensor array.

FIG. 25 is a sectional representation of a wireless power transmitter 2501 and an electrical component configured to function as a pressure-sensitive sensor array. This embodiment is similar to the embodiment of FIG. 23, except that it uses a pressure-sensitive material (e.g. a piezoresistive material 2504) rather than a piezoelectric material. In this embodiment, the electrical component includes a first plurality of conductive pads 2500 in a first plane and a second plurality of conductive pads 2502 in a second plane. The two sets of conductive pads 2500, 2502 sandwich a pressure-resistive material 2504. The pressure-resistive material 2504 is selected to present a discernible change in resistance when deformed by a force. In this embodiment, the pressure-resistive material is selected and configured to recognize when a remote device, such as a cell phone is placed on the surface of the electrical component (e.g. on top of the conductive pads). In this embodiment, the total thickness of the both conductive pads above and below the pressure-sensitive material would together be not substantially thicker than about 1/10 the skin depth of the material. In the case that these materials are two different materials, the sum of their thicknesses would be taken in terms of their individual skin depths. In this embodiment, the pressure-resistive material is somewhat conductive, but its resistance is so high that it can essentially be ignored for purposes of determining acceptable material thicknesses.

Figure 26:
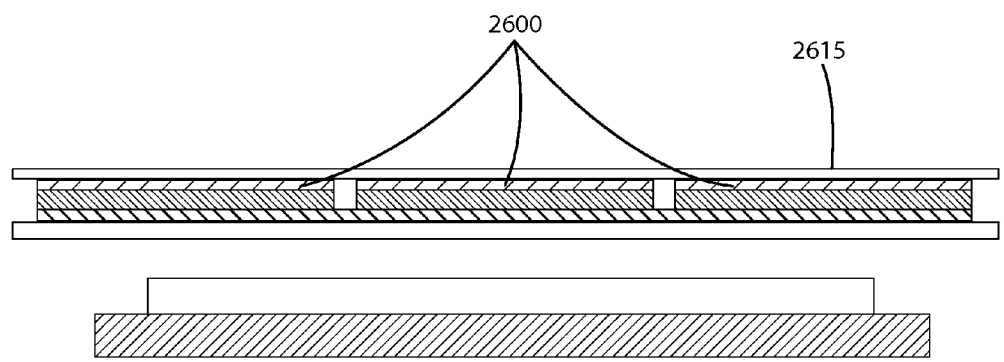
FIG. 26 is a sectional view showing another embodiment of the present invention in which the conductive pads and intermediate material are coated with a non-conductive material.

FIG. 26 is a schematic representation similar to FIG. 25, except that it illustrates a non-conductive coating 2615 disposed over the top array of conductive pads. The non-conductive coating 2615 may be applied to electrical component when it is desirable to prevent conduction from a conductive pad 2600 to an external element (such as a remote device), to prevent electrostatic discharge strikes and to resist wearing off of the conductive pads. Although the non-conductive coating 2615 is illustrated in combination with electrical component system of FIG. 25, the non-conductive coating may be applied over essentially any embodiment of the present invention in which the electrical component would otherwise have exposed conductive materials. The non-conductive coating 2615 may be applied in a liquid form and allowed to cure into a solid state. Alternatively, the non-conductive coating may be a non-conductive film or other non-conductive layer.

Figure 27:
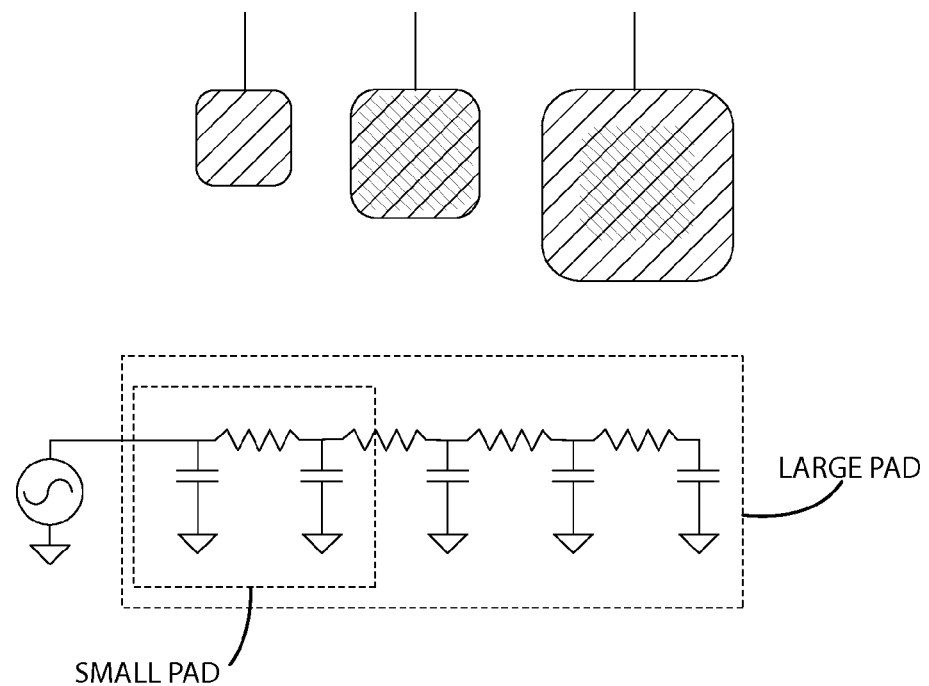
FIG. 27 is a representation showing the current density in different sized pads along with an equivalent circuit for the different pad sizes.

Although the illustrations typically show the conductive pads as generally square with rounded corners, the size and shape of the conductive pads may from application to application. For example, in the context of an electroluminescent display, the conductive pads may be shaped to define different size and shape regions. In some applications, it may, however, be desirable to limit the size of the conductive pads. As the size of a conductive pad increases, the capacitance of the conductive pad will increase, but so will the resistance of the conductive pad. It may be desirable to design conductive pads used in capacitive sensors so that the conductive area is not too large for the current flowing into the conductive area. Because the material is so thin, the current can crowd on the edges and corners of the material, preventing the charge from filling the plane evenly, and increasing the equivalent series resistance ("ESR") of the pad. FIG. 27 includes illustrations of three different size conductive pads. The conductive pads are shaded to represent current distribution within the pads. As can be seen, the current distribution becomes less uniform as the conductive pad gets larger. This phenomenon is due at least in part to current crowding. FIG. 27 also includes a schematic representation that illustrates the equivalent circuit for two different size conductive pads. As can be seen, increased conductive pad size results not only in increase capacitance, but also in increased resistance. Increased resistance can have a negative impact on the performance of some types of electrical components. For example, increased resistance in a conductive pad can have a material adverse impact on a system that incorporates a capacitive sensor or capacitive sensor array because increase resistance makes it more difficult to detect a change in the capacitance of the conductive pad. To address these issues, the conductive pad can either be made small enough to ensure that the ESR is low enough to not prevent accurate readings, or use a frequency much higher than the inductive power supply so that the effective skin depth of the material at the capacitive sensing frequency is near the thickness of the actual material. In typical low-power applications, it may desirable to limit the size of conductive pad so that its ESR remains under 100 ohms.

Figure 28:
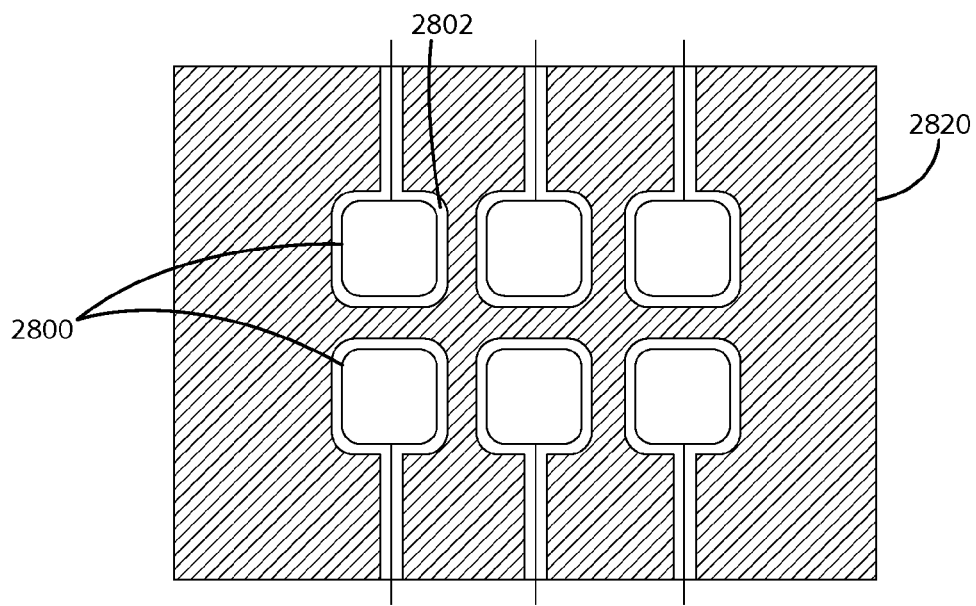
FIG. 28 is a representation of an array of conductive pads with a ground plane fill.

FIG. 22 shows an embodiment of a system in which the electrical component is a capacitive sensor array. In that embodiment, the system includes a single ground plane that extends beneath all of the conductive pads. FIG. 28 shows an alternative embodiment in which the system includes a ground plane fill 2820 around the conductive pads. In this embodiment, the ground plane 2820 may be useful in preventing interference between the conductive pad 2800 and from other potential sources. The conductive pads 2800 and the ground plane 2820 form an effective capacitance around the edges of the pads. The capacitance measured by the controller changes when a material (such as a plastic housing or human tissue) forms a dielectric "bridge" between the conductive pad and the ground plane. As in other application, the thickness of the conductive pads, the thickness of the ground plane and the thickness of the conductive leads may be not substantially greater than 1/10th the skin depth of the corresponding materials at the frequency of the wireless power supply. The gap 2802 between the conductive pads and the ground plane may vary from application to application, as desired.

Figure 34:
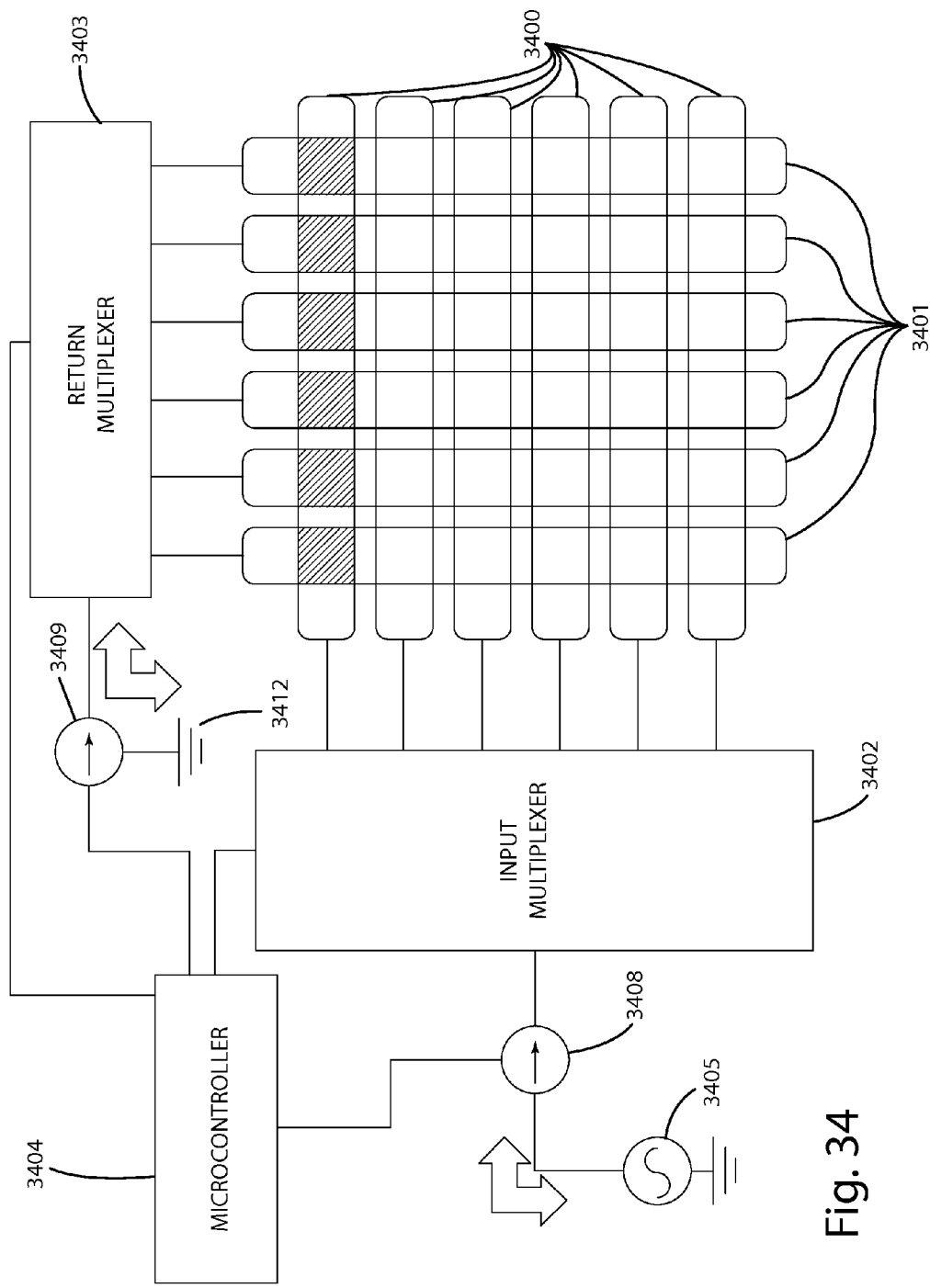
FIG. 34 is a schematic representation of an electroluminescent display/sensor having an array of conductive fingers.
Figure 36:
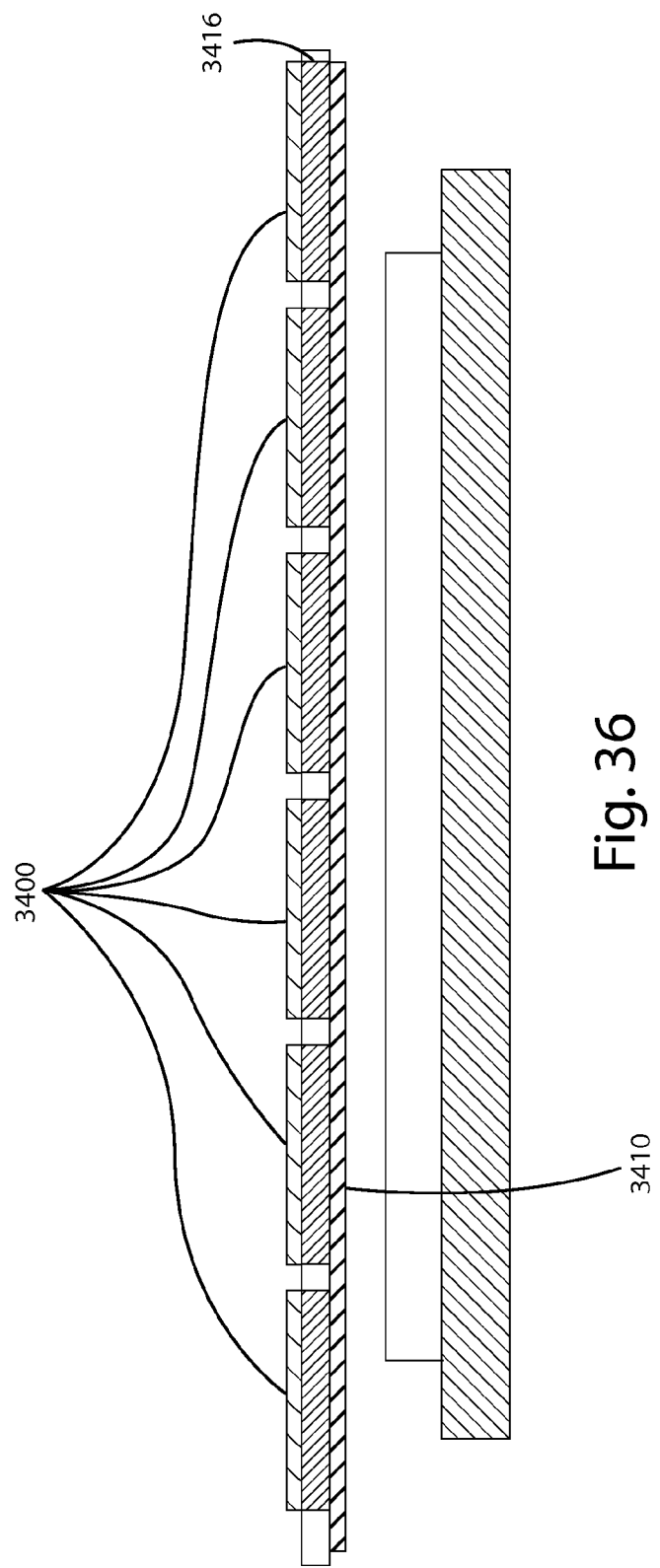
FIG. 36 is a representational section view of the electroluminescent display/sensor of FIGS. 34 and 35.

In alternative embodiments, the electrical component may be an electroluminescent display configured to illuminate pixels and to function as a capacitive sensor, as desired. Referring now to FIGS. 34 and 36, the electrical component generally includes a controller (e.g. microcontroller 3404), a power source 3405, an input multiplexer 3402, a first plurality of parallel conductive pads 3400, a return multiplexer, a second plurality of conductive pads 3401 extending substantially perpendicular to first plurality of conductive pads, a plurality of regions of electroluminescent material 3416 disposed between the overlapping portions of the first and second conductive pads, an input sensor 3408 and a return sensor 3409. As perhaps best shown FIG. 36, the first plurality of parallel conductive pads 3400 is spaced apart form the second plurality of parallel conductive pads 3401 and the regions of electroluminescent material 3416 are sandwich between in the regions where the pads overlap. In this embodiment, the controller 3404 is operatively connected to the input multiplexer 3408 to control which of the first conductive pads 3400 is coupled to input power 3405 and the return multiplexer 3403 to control which of the second conductive pads 3401 is coupled to ground 3412. The controller 3404 is also operatively connected to the input sensor 3408 and the return sensor 3409 so that it can obtain measurements of the current and/or voltage in the power input 3405 or the return line. As in other application, the combined thickness of the two sets of conductive pads may be not substantially greater than 1/10th the skin depth of the corresponding materials at the frequency of the wireless power supply.

Figure 35:
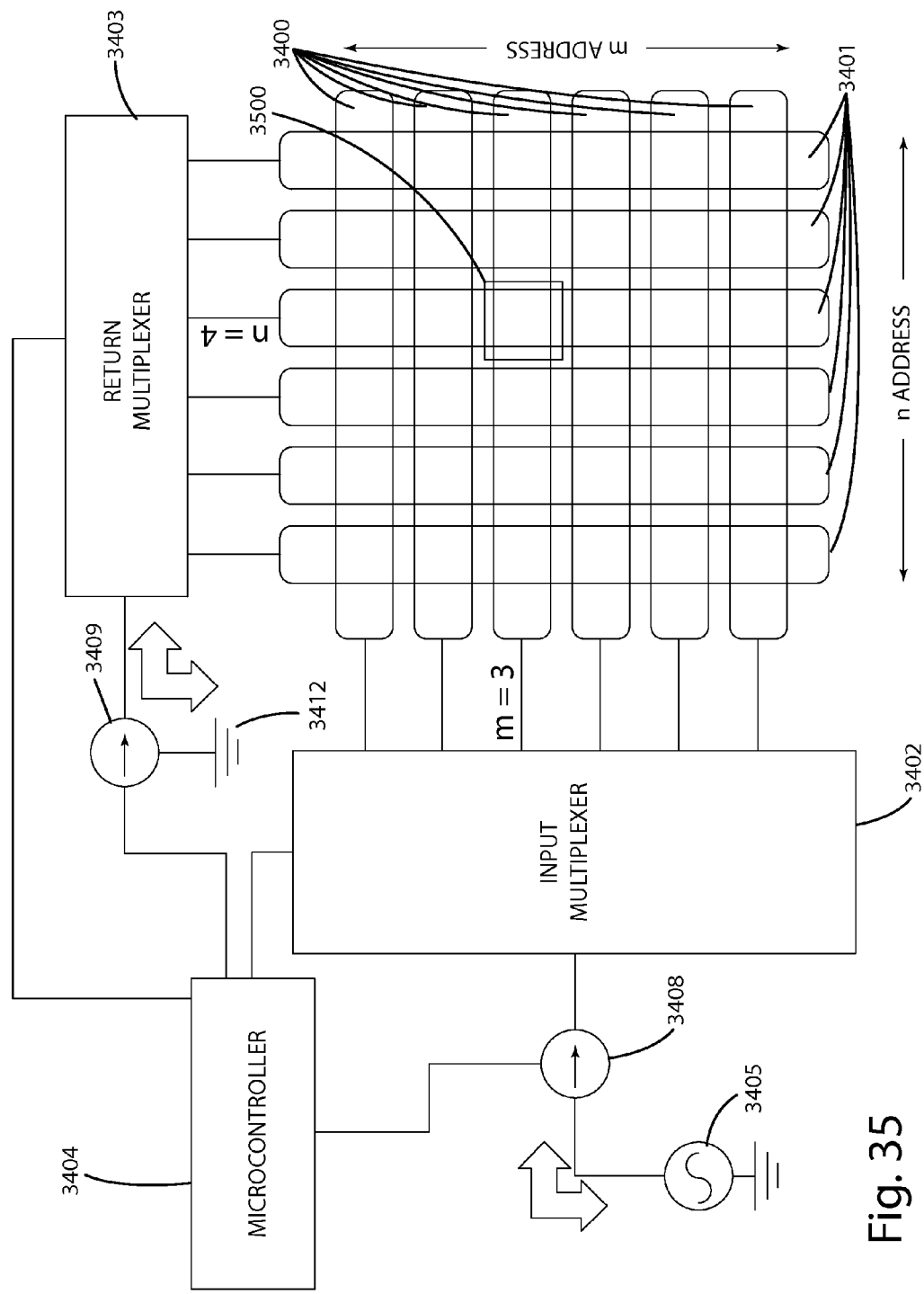
FIG. 35 is a schematic representation of an electroluminescent display/sensor of FIG. 34 illustrating the illumination of a single pixel.

Operation of the electrical component system will now be described with reference to FIG. 35. To operate as a display, the controller 3402 causes the system to illuminate the desired pixel 3500 by sending a control signal to the input multiplexer 3402 to connect the input power 3405 to the appropriate conductive pad in the first plurality of conductive pads 3400. This will be the conductive pad in the row of the pixel to be illuminated. In the example illustrated in FIG. 35, the input multiplexer 3402 connects the input power to the conductive pad that forms the third row of the display. The controller 3404 will also send a control signal to the return multiplexer 3403 to connect the appropriate conductive pad in the second plurality of conductive pads 3401 to ground 3412 (or to the return line to the power source). This will be the conductive pad in the column of the pixel to be illuminated. In the example illustrated in FIG. 35, the return multiplexer connects the conductive pad that forms the fourth column of the display to ground (or to the return line). As a result, the electroluminescent pixel at row 3 and column 4 of the display will illuminate. To illuminate multiple pixels, the controller 3404 may cause the two multiplexers to quickly cycle through the appropriate rows and columns to sequentially apply power to and illuminate all of the desired pixels. To operate as a capacitive sensor array, the controller may cause the input multiplexer 3402 and the return multiplexer 3403 to cycle through the desired pixels where capacitive sensing is to be performed. In applications with relatively small pixel size it may not be necessary to cycle through all of the pixels to obtain the desired information. For example, the sensor may be provided with adequate resolution by cycling through only one pixel in each square centimeter of the display. As the multiplexers cycle through the desired "sensor" pixels, the controller may obtain corresponding measurements of the current and/or voltage in the input sensor and the return sensor. The controller 3404 may determine when an object is in proximity to a sensor pixel based on the sensor readings. For example, the controller may consider the input sensor readings, the return sensor readings or a combination of both readings. In some applications, it may be desirable to apply a lesser amount of power to the conductive pads when operating in a sensor mode. More specifically, it may be desirable to apply an amount of power that is less than the power required to illuminate the pixels so that the pixels do not illuminate during the sensor mode.

Although the display embodiments of the present invention are described primarily in connection with electroluminescent displays, the present invention may be implemented in other types of displays. For example, the present invention may be incorporated into an OLED type display or an E-ink type display. These display technologies are well-known and therefore will not be described in detail. Suffice it to say that the OLED type display may include an emissive electroluminescent material formed from a layer of organic compounds sandwiched between a pair of conductive pads (e.g. electrodes), and that the E-ink type display may include microcapsules disposed between conductive materials (e.g. an electrode and an electrode pixel layer). In each case, the conductive materials in the display are sufficiently thin to avoid excessive heat gain and excessive power loss. In an OLED type display, the electrodes are sufficiently thin that they do not collective exceed 1/10th the skin depth at the frequency of the wireless power supply. In E-ink type displays, the combined thickness of the electrode and the electrode pixel layer do not exceed 1/10th the skin depth at the frequency of the wireless power supply.

In another aspect, the present invention may be used to provide a wireless power supply that is also capable of functioning as a wire-free conductive power supply. Technologies have been created to provide power to remote devices by providing a conductive surface capable of selecting areas to apply power and ground, providing power to exposed contacts (e.g. pins) on the remote device. For example, WildCharge™ Technology provided by PureEnergy Solutions is one commercially available conductive power supply technology. Using exposed thin conductive materials in accordance with the present invention, a wireless power supply can be made to accept both wirelessly powered remote devices and conductively powered remote devices. For example, the power transfer surface of the wireless power supply may include a plurality of parallel conductive pads that are exposed and function in essentially the same manner as the parallel conductive pads on a conventional conductive power supply. When a wireless remote device is placed on the power transfer surface, the wireless power supply can transmit power to the remote device using an electromagnetic field, and when a conductive remote device is placed on the power transfer surface, the wireless power supply can instead apply power to the remote device conductively using the conductive pads. Similarly, a remote device may have conductive areas on a surface that allow the remote device to be configured to receive power from a wireless power supply or from direct electrical connections. For example, the undersurface of the remote device through which wireless power enters the remote device may include a plurality of conductive pads (e.g. three conductive pads arranged in a triangular pattern) that form contacts for receiving power from a wire-free conductive power supply. In this embodiment, the conductive pads are exposed and function in essentially the same manner as the contacts on a remote device configured to receive power from a conventional conductive wire-free power supply. In this aspect of the invention, the thin conductive material may have a thickness that is not substantially greater than 1/10th the skin depth of the material at the frequency of the wireless power supply.

In another alternative embodiment, the present invention may provide a method for making the surface of a material appear metallic for aesthetic purposes while still being able to efficiently transfer wireless power through the surface. The surfaces can be on the wireless power supply, the remote device or on an intermediate component, such as a resonating adaptor that might be positioned between the wireless power supply and the remote device. In some applications, the surface may include a thicker metal housing with an aperture formed through the metal. The aperture size may vary, but in one application is of sufficient size to cover the effective electromagnetic field of the wireless power supply transmitter. The aperture may be filled with a non-conductive material and may be coated with a thin conductive material having a thickness that is determined in accordance with the methods set forth above. For example, the thin conductive material may have a thickness that is not substantially greater than 1/10th the skin depth of the material at the frequency of the wireless power supply. The non-conductive material filling the aperture may alternatively be a low-conductive material disclosed in U.S. Provisional Application No. 61/583,840, entitled "Composite Metal Surface," filed on Jan. 6, 2012, by Moes et al. If desired, the thin conductive material may be covered by a hard and clear top-coat to prevent rubbing or wearing of the thin conductive material, which helps to prevent the material from rubbing off the surface.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to claim elements in the singular, for example, using the articles "a," "an," "the" or "said," is not to be construed as limiting the element to the singular. This disclosure is presented for illustrative purposes and should not be interpreted as an exhaustive description of all embodiments of the invention or to limit the scope of the invention to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features and/or elements and that might individually or cooperatively provide a collection of benefits. The present invention is not limited to only those embodiments that include all of these features and/or elements or that provide all of the stated benefits. Instead, the present invention may extend to any permutation, combination or subcombination of the disclosed features and/or elements.

The embodiments of the invention in which an exclusive property or privilege is claimed are defined as follows:

1. An electrical component for use in the electromagnetic field path of a wireless power supply comprising:
   a conductive material configured to extend substantially perpendicularly to the electromagnetic field path, said conductive material having a thickness selected to have a heat gain no greater than an acceptable heat gain and a power loss no greater than an acceptable power loss at an anticipated electromagnetic field operating frequency, wherein said conductive material forms part of at least one of a display, a sensor, and an external housing;
   wherein said thickness is selected such that the conductive material has a power loss of less than 1 Watt per cubic centimeter.

2. The component of claim 1 wherein said thickness is not substantially greater than about $\frac{1}{10}$th a skin depth of said conductive material at an anticipated electromagnetic field operating frequency.

3. The component of claim 1 wherein said conductive material is an electrode in said display.

4. The component of claim 3 wherein said conductive material includes a first electrode and a second electrode, a combined thickness of said first electrode and said second electrode being not substantially greater than about $\frac{1}{10}$th a skin depth of said conductive material at an anticipated electromagnetic field operating frequency.

5. The component of claim 4 wherein said display an electroluminescent display, said electroluminescent display including an electroluminescent material disposed between said first and second electrodes.

6. The component of claim 1 wherein said display includes a plurality of first electrodes arranged in a first plane and a plurality of second electrodes arranged in a second plane substantially parallel to and spaced apart from said first plane, a sum of a thickness of said first electrodes and said second electrode in a direction substantially perpendicular to said first plane being not substantially greater than about $\frac{1}{10}$th a skin depth of said conductive material at an anticipated electromagnetic field operating frequency.

7. The component of claim 1 wherein said conductive material includes an electrode in said sensor, said thickness not substantially greater than about $\frac{1}{10}$th a skin depth of said conductive material at an anticipated electromagnetic field operating frequency.

8. The component of claim 1 wherein said conductive material including an electrode and a ground plane in said sensor, said electrode extending in a first plane and said ground plane extending in a second plane substantially parallel to and spaced apart from said first plane, a sum of a thickness of said electrode and said ground plane in a direction substantially perpendicular to said first plane being not substantially greater than about $\frac{1}{10}$th a skin depth of said conductive material at an anticipated electromagnetic field operating frequency.

9. A wireless power supply system comprising:
   a wireless power supply having a transmitter to generate an electromagnetic field at a frequency; and
   an electrical component disposed within a flow path of the electromagnetic field, said electrical component including a conductive material extending substantially perpendicularly to the electromagnetic field path, said conductive material having a thickness selected to have a heat gain no greater than an acceptable heat gain and a power loss no greater than an acceptable power loss at the frequency, wherein said electrical component includes at least one of a display, a sensor, and an external housing;
   wherein said thickness is selected such that the conductive material has a power loss of less than 1 Watt per cubic centimeter.

10. The wireless power supply system of claim 9 wherein said electrical component is a electroluminescent display, said electroluminescent display including an electroluminescent material disposed between a pair of spaced-apart conductive pads, a sum of a thickness of said conductive pads being not substantially greater than about $\frac{1}{10}$th a skin depth of said conductive pads at the frequency of the wireless power supply.

11. The wireless power supply system of claim 9 wherein said electrical component is a piezoelectric sensor, said piezoelectric sensor including a piezoelectric material disposed between a pair of spaced-apart conductive pads, a sum of a thickness of said conductive pads being not substantially greater than about $\frac{1}{10}$th a skin depth of said conductive pads at the frequency.

12. The wireless power supply system of claim 9 wherein said electrical component is a piezoresistive sensor, said piezoresistive sensor including a piezoresistive material disposed between a pair of spaced-apart conductive pads, a sum of a thickness of said conductive pads being not substantially greater than about $\frac{1}{10}$th a skin depth of said conductive pads at the frequency.

13. The wireless power supply system of claim 9 wherein said electrical component is a capacitive sensor, said capacitive sensor including a conductive pads having a thickness not substantially greater than about $\frac{1}{10}$th a skin depth of said conductive pads at the frequency.

14. The wireless power supply system of claim 9 wherein said electrical component includes a plurality of conductive pads and a plurality of conductive leads extending from said pads, a thickness of said conductive pads being not substantially greater than about 1/10th a skin depth of said conductive pads at the frequency, a thickness of said conductive leads being not substantially greater than about 1/10th a skin depth of said conductive pads at the frequency.

15. The wireless power supply system of claim 9 wherein the wireless power supply is capable of supplying power to a remote device via an electromagnetic field or conductive power transfer, said electrical component includes a plurality of conductive pads, said conductive pads being exposed on a power transfer surface of the wireless power supply to provide an array of conductors for selectively providing power to a remote device via conductive power transfer, a thickness of said conductive pads being not substantially greater than about 1/10th a skin depth of said conductive pads at the frequency.

16. The wireless power supply system of claim 9 wherein said electrical component is an organic light-emitting diode display, said display including an emissive electroluminescent material formed from a layer of organic compounds, said emissive electroluminescent material disposed between a pair of spaced-apart conductive pads, a sum of a thickness of said conductive pads being not substantially greater than about 1/10th a skin depth of said conductive pads at the frequency.

17. The wireless power supply system of claim 9 wherein said electrical component is an E-ink display, said display including a plurality of microcapsules disposed between an electrode layer and an electrode pixel layer, a sum of a thickness of said electrode layer and said electrode pixel layer being not substantially greater than about 1/10th a skin depth of said electrode layer and said electrode pixel layer at the frequency.

18. A wireless power supply comprising:
   a transmitter capable of generating an electromagnetic field for wirelessly supplying power to a remote device, said electromagnetic field having a frequency and a path;
   a power transfer surface disposed adjacent said transmitter in said path, said surface being capable of selectively receiving the remote device;
   a display disposed in said path, said display having a pair of spaced-apart conductive pads, a sum of a thickness of said conductive pads being not substantially greater than about 1/10th a skin depth of said conductive pads at the frequency;
   a communication system capable of receiving communications from the remote device; and
   a controller for operating said display in response to communication from the remote device;
   wherein said thickness is selected such that the conductive material has a power loss of less than 1 Watt per cubic centimeter.

19. The wireless power supply of claim 18 wherein said display is an electroluminescent display, said electroluminescent display including an electroluminescent material disposed between said conductive pads, whereby application of AC power to said conductive pads illuminates said electroluminescent material.

20. A wireless power supply comprising:
   a transmitter capable of generating an electromagnetic field for wirelessly supplying power to a remote device, said electromagnetic field having a frequency and a path;
   a power transfer surface disposed adjacent said transmitter in said path, said surface being capable of selectively receiving the remote device;
   a sensor disposed in said path, said sensor having at least one conductive pads, a thickness of said conductive pad being not substantially greater than about 1/10th a skin depth of said conductive pads at the frequency; and
   a controller capable of applying power to said sensor and of measuring a characteristic of power applied to said sensor to determine when an object is in proximity to said sensor;
   wherein said thickness is selected such that the conductive material has a power loss of less than 1 Watt per cubic centimeter.

21. The wireless power supply of claim 20 wherein said sensor is a pressure-sensitive sensor, said sensor having at least two spaced-apart conductive pads, a pressure-sensitive material disposed between said pads.

22. The wireless power supply of claim 20 wherein said sensor includes an array of conductive pads.

23. The wireless power supply of claim 22 wherein said array of conductive pads are a capacitive sensor array, said controller capable of individually applying power to each of said conductive pads and of individually measuring a characteristic of power applied to each of said conductive pads to determine when an object is in proximity to said sensor.

24. A housing for a component of a wireless power supply system comprising:
   a metal surface defining an aperture and having an outer surface;
   a non-conductive material disposed in said aperture;
   a layer of conductive material disposed over said non-conductive material on said outer surface, said layer having a thickness not substantially greater than about 1/10th a skin depth of said conductive material at a frequency of the wireless power supply;
   wherein said thickness is selected such that the conductive material has a power loss of less than 1 Watt per cubic centimeter.

25. The housing of claim 24 further including a transparent top-coat disposed over said layer of conductive material.

26. A method for manufacturing an electrical component for use in an electromagnetic field, comprising the steps of:
   determining an anticipated frequency of the electromagnetic field;
   determining a skin depth of a conductive material;
   manufacturing an electrical component with a first conductive element extending substantially perpendicularly to an anticipated electromagnetic field path, the conductive element having a thickness selected to have a heat gain no greater than an acceptable heat gain and a power loss no greater than an acceptable power loss at the anticipated frequency, wherein the electrical component includes at least one of a display, a sensor, and an external housing;
   wherein said thickness is selected such that the conductive material has a power loss of less than 1 Watt per cubic centimeter.

27. The method of claim 26 wherein said thickness is not substantially greater than about 1/10th a skin depth of the conductive material at the anticipated frequency.

28. The method of claim 26 further including the step of manufacturing the electrical component with a second conductive element spaced apart from the first conductive element along the anticipated field path, a sum of a thickness of said first conductive element and said second conductive element being not substantially greater than about 1/10th a skin depth of said conductive elements at the frequency.

29. The method of claim 26 wherein the electrical component is a display.

30. The method of claim 26 wherein the electrical component is a sensor.

31. The method of claim 26 wherein the electrical component is selectively capable of functioning as a display and a sensor.

* * * * *